United States Patent
Kato et al.

(10) Patent No.: US 10,784,929 B2
(45) Date of Patent: *Sep. 22, 2020

(54) WIRELESS IC DEVICE

(71) Applicant: Murata Manufacturing Co., Ltd., Nagaokakyo-shi, Kyoto-fu (JP)

(72) Inventors: Noboru Kato, Nagaokakyo (JP); Makoto Yasutake, Nagaokakyo (JP); Shinichiro Banba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 62 days.

This patent is subject to a terminal disclaimer.

(21) Appl. No.: 16/174,340

(22) Filed: Oct. 30, 2018

(65) Prior Publication Data

US 2019/0074869 A1   Mar. 7, 2019

Related U.S. Application Data

(63) Continuation of application No. 15/286,601, filed on Oct. 6, 2016, now Pat. No. 10,153,810, which is a (Continued)

(30) Foreign Application Priority Data

Dec. 19, 2014   (JP) .................................. 2014-257336

(51) Int. Cl.
*H04B 5/00* (2006.01)
*G06K 19/07* (2006.01)
(Continued)

(52) U.S. Cl.
CPC ........... *H04B 5/0081* (2013.01); *G06K 19/07* (2013.01); *G06K 19/077* (2013.01);
(Continued)

(58) Field of Classification Search
CPC ...... G06K 19/007745–07747; G06K 10/0775; H06K 19/07784; H01Q 1/40; H01Q 11/08; H01Q 1/2283; H01Q 23/00
See application file for complete search history.

(56) References Cited

U.S. PATENT DOCUMENTS 10,153,810 B2 * 12/2018 Kato .................... H01L 23/3121
2011/0062244 A1 * 3/2011 Kato ........................ H01Q 7/00
235/492

OTHER PUBLICATIONS

Kato et al., "Wireless IC Device, Molded Resin Article, and Method for Manufacturing Wireless IC Device", U.S. Appl. No. 15/286,601, filed Oct. 6, 2016.

* cited by examiner

*Primary Examiner* — Alia Sabur
(74) *Attorney, Agent, or Firm* — Keating & Bennett, LLP

(57) ABSTRACT

A wireless IC device includes a resin member including first and second surfaces, a substrate including first and second principal surfaces, a coil antenna provided in the resin member, and an RFIC element mounted on the substrate and connected to the coil antenna. The substrate is embedded in the resin member so that the second principal surface is at a second surface side. The coil antenna is defined by first linear conductor patterns on the second surface, first metal posts extending between the first and second surfaces, second metal posts extending between the first and second surfaces, and second linear conductor patterns on the first surface. The RFIC element is disposed in the coil antenna.

12 Claims, 22 Drawing Sheets

Related U.S. Application Data continuation of application No. PCT/JP2015/072175, filed on Aug. 5, 2015.

(51) Int. Cl.
*G06K 19/077* (2006.01)
*H01Q 7/00* (2006.01)
*H01L 23/31* (2006.01)
*H01Q 1/22* (2006.01)
*H01L 21/56* (2006.01)
*H01L 23/498* (2006.01)
*H01L 23/66* (2006.01)

(52) U.S. Cl.
CPC ..... *G06K 19/0723* (2013.01); *G06K 19/0775* (2013.01); *G06K 19/07722* (2013.01); *G06K 19/07745* (2013.01); *G06K 19/07754* (2013.01); *G06K 19/07779* (2013.01); *G06K 19/07784* (2013.01); *H01L 21/565* (2013.01); *H01L 23/3107* (2013.01); *H01L 23/3121* (2013.01); *H01L 23/49838* (2013.01); *H01L 23/66* (2013.01); *H01Q 1/2283* (2013.01); *H01Q 7/00* (2013.01); *H04B 5/0062* (2013.01); *H01L 21/568* (2013.01); *H01L 2223/6677* (2013.01); *H01L 2224/131* (2013.01); *H01L 2224/16227* (2013.01); *H01L 2224/48227* (2013.01); *H01L 2224/81815* (2013.01); *H01L 2924/1421* (2013.01); *H01L 2924/1531* (2013.01); *H01L 2924/15192* (2013.01); *H01L 2924/15313* (2013.01); *H01L 2924/19041* (2013.01); *H01L 2924/19105* (2013.01)

⟨present embodiment⟩

⟨reference example⟩

WIRELESS IC DEVICE

CROSS REFERENCE TO RELATED APPLICATIONS

This application claims the benefit of priority to Japanese Patent Application 2014-257336 filed Dec. 19, 2014 and is a Continuation Application of PCT/JP2015/072175 filed on Aug. 5, 2015. The entire contents of each application are hereby incorporated herein by reference.

BACKGROUND OF THE INVENTION

1. Field of the Invention

The present invention relates to a wireless IC device for use in, for example, a near field wireless communication device, such as a radio frequency identification (RFID) tag, and also relates to a molded resin article including the wireless IC device and a method for manufacturing the wireless IC device.

2. Description of the Related Art

Although HF-band RFID tags are generally card-sized, small RFID tags that occupy a small area are also needed for the purpose of, for example, merchandise management. Examples of small HF-band RFID tags include RFID tags having shapes described in Patent Documents Japanese Unexamined Patent Application Publication No. 2007-102348 and International Publication No. 2011/108340. These small RFID tags are RFID tags that are formed by using a sheet laminating method and in which an RFIC chip is mounted on a multilayer substrate having a layered type coil antenna disposed therein.

Through the development of the above-described small RFID tags, the inventors have discovered that the RFID tags described in Japanese Unexamined Patent Application Publication No. 2007-102348 and International Publication No. 2011/108340 have the following problems.

In the RFID tags described in Japanese Unexamined Patent Application Publication No. 2007-102348 and International Publication No. 2011/108340, an RFIC chip is disposed on the central axis of a coil antenna or in a coil opening of the coil antenna. Therefore, the electrodes (land patterns) used to mount the RFIC chip intersect the winding axis of the coil antenna. As a result, the RFIC chip and the electrodes used to mount the RFIC chip tend to impede the formation of a magnetic field by the coil antenna. Although the formation of the magnetic field is not easily impeded when the RFIC chip is disposed at an outer side portion of the coil opening, the occupied area increases in such a case.

Since the RFIC chip is disposed on the central axis of the coil antenna or in the coil opening of the coil antenna, there is a possibility that various circuits included in the RFIC chip will malfunction due to the influence of the magnetic field. In addition, when the coil antenna transmits and receives a weak magnetic field, there is a possibility that the performance (sensitivity) of the coil antenna will be reduced due to noise generated by a digital circuit unit included in the RFIC chip.

When, in particular, the coil antenna is manufactured by a sheet laminating method, it is necessary to consider the displacements of the sheets (lamination position accuracy) and flatness of the multilayer body; therefore, there is a limit to how much the number of laminated sheets can be increased and how thick the coil pattern can be made. For this reason, the achievable inductance value is limited, and it is particularly difficult to realize a coil antenna having a low direct current resistance (DCR). It is possible to form a coil pattern having a coil winding axis that extends in a planar direction of the sheets. However, in such a case, since the number of sheets that can be laminated is limited, it is difficult to increase the coil opening area and to obtain a coil antenna having a low direct current resistance.

SUMMARY OF THE INVENTION

Accordingly, preferred embodiments of the present invention provide a wireless IC device that includes a coil antenna having good electrical characteristics, in particular, a low direct current resistance, and in which interference between an RFIC chip and the coil antenna is low, and also provide a molded resin article including the wireless IC device and a method for manufacturing the wireless IC device.

A wireless IC device according to a preferred embodiment of the present invention includes a resin member including a first surface and a second surface that faces the first surface; a substrate including a first principal surface and a second principal surface that faces the first principal surface, the substrate being embedded in the resin member so that the second principal surface is at a second-surface side of the resin member; an RFIC element mounted on the first principal surface of the substrate; and a coil antenna connected to the RFIC element, the coil antenna including a first linear conductor pattern on the second surface of the resin member, a first metal post including a first end and a second end that extend to the first surface and the second surface of the resin member, the first end being connected to the first linear conductor pattern, a second metal post including a first end and a second end that extend to the first surface and the second surface of the resin member, the first end being connected to the first linear conductor pattern, and a second linear conductor pattern on the first surface of the resin member, the second linear conductor pattern connecting the second end of the first metal post and the second end of the second metal post to each other, the substrate is embedded in the resin member so that the second principal surface of the substrate and the second surface of the resin member are flush with each other, the first linear conductor pattern extends over the second principal surface of the substrate and the second surface of the resin member, and the RFIC element is disposed in the coil antenna and is connected to the first linear conductor pattern by an interlayer conductor in the substrate.

With the above-described structure, since portions of the pattern of the coil antenna are defined by the metal posts, a coil structure that is relatively tall and in which the size of the coil openings is able to be freely designed is easily realized. In addition, since the resistance of the coil antenna is significantly reduced, a wireless IC device having a high sensitivity or a wireless IC device that is small even though the sensitivity thereof is high is obtained.

In addition, since surface mount chip components, such as the RFIC element, are disposed in the coil antenna, the entirety of the wireless IC device is durable. In particular, since the RFIC element is able to be easily arranged so as not to be exposed to the outside of the wireless IC device, the function of protecting the RFIC element is improved, and an increase in size that occurs when the RFIC element is mounted on the exterior is avoided.

In addition, with this structure, a large thermal load is not easily applied to connecting portions between the surface mount chip components, such as the RFIC element, and, for example, the power supply terminals, and to the surface mount devices. Accordingly, even when the wireless IC device is embedded in a molded resin object (toy, container, etc.), sufficient operational reliability of the surface mount chip components is able to be ensured, and the reliability of the connecting portions between the surface mount devices and, for example, the power supply terminals is able to be increased. Thus, a highly heat-resistant wireless IC device that is able to be disposed in a molded resin article, in other words, that is resistant to high temperature during injection molding, is realized.

The first linear conductor pattern and the second linear conductor pattern are able to be easily formed by forming the conductor patterns on the surfaces of the resin member, and the first linear conductor pattern is able to be easily connected to the first metal post and the second metal post. In addition, since the metal posts define relatively tall conductors, the number of connecting locations is smaller than that in the case where, for example, conductors extending in the height direction are formed by laminating a plurality of base layers having interlayer conductors. Accordingly, the electrical reliability of the coil antenna is increased. In addition, with this structure, the interlayer conductor of the substrate is able to be easily connected to the first linear conductor pattern, and the reliability of the connection between the interlayer conductor of the substrate and the first linear conductor pattern is able to be increased.

In a preferred embodiment of the present invention, preferably, a magnetic body (for example, a magnetic ferrite material) that defines a magnetic core for a coil including the first metal post, the second metal post, the first linear conductor pattern, and the second linear conductor pattern is further included. With this structure, a coil antenna with a predetermined inductance is able to be obtained without increasing the size of the coil antenna.

In a preferred embodiment of the present invention, preferably, the first linear conductor pattern, the second linear conductor pattern, the first metal post, and the second metal post are provided in a plurality, the plurality of the first linear conductor patterns extend in an X-axis direction of an orthogonal X-Y-Z coordinate system, the plurality of the second linear conductor patterns extend in the X-axis direction of the orthogonal X-Y-Z coordinate system, the plurality of the first metal posts are arranged in a Y-axis direction of the orthogonal X-Y-Z coordinate system and extend in a Z-axis direction of the orthogonal X-Y-Z coordinate system, the plurality of the second metal posts are arranged in the Y-axis direction of the orthogonal X-Y-Z coordinate system and extend in the Z-axis direction of the orthogonal X-Y-Z coordinate system, and the first metal posts, the second metal posts, the first linear conductor patterns, and the second linear conductor patterns define a helical coil.

With the above-described structure, a coil having a large number of turns is easily provided.

In a preferred embodiment of the present invention, preferably, at least one of the plurality of the first linear conductor patterns extends through a region that overlaps the second principal surface of the substrate when viewed in the Z-axis direction, and connects the first end of at least one of the plurality of the first metal posts and the first end of at least one of second metal posts to each other. In this case, a bridge pattern (jumper wiring) is able to be provided by using the second principal surface, which is at a side opposite to the first principal surface on which the RFIC element is mounted.

In a preferred embodiment of the present invention, preferably, the number of the first metal posts and the number of the second metal posts are each 3 or more, and the plurality of the first metal posts and the plurality of the second metal posts are arranged in the Y-axis direction and are disposed in a staggered pattern when viewed in the Z-axis direction.

With the above-described structure, the dimension in the Y-axis direction is able to be reduced even when the number of turns is large.

In a preferred embodiment of the present invention, preferably, the helical coil includes a plurality of types of loops including different inner and outer diameters when viewed in the Y-axis direction, and two loops at opening surfaces of the helical coil are loops of one of the plurality of types of loops that has largest inner and outer diameters. With this structure, the practical area of the coil openings through which the magnetic flux extends from and returns to the helical coil is increased.

In a preferred embodiment of the present invention, preferably, the RFIC element is connected to the interlayer conductor by a wiring conductor pattern on the first principal surface of the substrate. The RFIC element may instead be directly connected to the interlayer conductor. However, when the RFIC element is connected to the interlayer conductor by a wiring conductor pattern to provide routing, the interlayer conductor may extend to any position on the second principal surface of the substrate. In particular, this facilitates the formation of the bridge pattern.

A power supply terminal to be connected to the RFIC element is preferably provided on a portion of the wiring conductor pattern. In this case, the RFIC element and the mounting electrode do not easily impede the formation of a magnetic field by the coil antenna, and interference between the coil antenna and the RFIC element is significantly reduced or minimized.

In a preferred embodiment of the present invention, preferably, a capacitor connected to the RFIC element is further included. With this structure, a circuit to match the RFIC element and the coil antenna or to set the resonant frequency is easily provided, and an external circuit can be omitted or simplified.

A molded resin article according to a preferred embodiment of the present invention includes a wireless IC device embedded therein, the wireless IC device including a resin member including a first surface and a second surface that faces the first surface, a substrate including a first principal surface and a second principal surface that faces the first principal surface, the substrate being embedded in the resin member so that the second principal surface is at a second-surface side of the resin member, an RFIC element mounted on the first principal surface of the substrate, and a coil antenna connected to the RFIC element, the coil antenna including a first linear conductor pattern on the second surface of the resin member, a first metal post including a first end and a second end that extend to the first surface and the second surface of the resin member, the first end being connected to the first linear conductor pattern, a second metal post including a first end and a second end that extend to the first surface and the second surface of the resin member, the first end being connected to the first linear conductor pattern, and a second linear conductor pattern on the first surface of the resin member, the second linear conductor pattern connecting the second end of the first metal post and the second end of the second metal post to each other, and the substrate is embedded in the resin member so that the second principal surface of the substrate and the second surface of the resin member are flush with each other, the first linear conductor pattern extends over the second principal surface of the substrate and the second surface of the resin member, and the RFIC element is disposed in the coil antenna and is connected to the first linear conductor pattern by an interlayer conductor in the substrate.

With this structure, a molded resin article in which a wireless IC device that has a high sensitivity even though the size thereof is small, or a wireless IC device that is small even though the sensitivity thereof is high, is obtained.

A method for manufacturing a wireless IC device according to a preferred embodiment of the present invention includes a component mounting step of mounting a substrate, on which an RFIC element is mounted and which includes a first principal surface, on a base and placing a first metal post and a second metal post on the base; a coating step of coating the base with a resin member so that the resin member reaches a height such that at least the RFIC element and the substrate are embedded in the resin member, forming a first surface on the resin member, and forming a second end on each of the first metal post and the second metal post; a removing step of removing the base, forming a second principal surface that faces the first principal surface on the substrate, forming a second surface that faces the first surface on the resin member, and forming a first end on each of the first metal post and the second metal post, the removing step being performed after the coating step; a first conductor forming step of forming a first linear conductor pattern on the second surface of the resin member and the second principal surface of the substrate after the removing step; and a second conductor forming step of forming a second linear conductor pattern on the first surface of the resin member after the coating step, the second linear conductor pattern including a first end connected to the second end of the first metal post and a second end connected to the second end of the second metal post.

A method for manufacturing a wireless IC device according to a preferred embodiment of the present invention includes a substrate mounting step of mounting a substrate, on which an RFIC element is mounted and which includes a first principal surface, on a base; a coating step of coating the base with a resin member so that the resin member reaches a height such that at least the RFIC element and the substrate are embedded in the resin member; a post mounting step of arranging a first metal post and a second metal post in the resin member so that the first metal post and the second metal post extend in a normal direction to the base, forming a first surface on the resin member, and forming a second end on each of the first metal post and the second metal post, the post mounting step being performed after the coating step; a removing step of removing the base, forming a second principal surface that faces the first principal surface on the substrate, forming a second surface that faces the first surface on the resin member, and forming a first end on each of the first metal post and the second metal post, the removing step being performed after the coating step; a first conductor forming step of forming a first linear conductor pattern on the second surface of the resin member and the second principal surface of the substrate after the removing step; and a second conductor forming step of forming a second linear conductor pattern on the first surface of the resin member after the post mounting step, the second linear conductor pattern including a first end connected to the second end of the first metal post and a second end connected to the second end of the second metal post.

With the manufacturing methods according to preferred embodiments of the present invention, a durable, highly heat resistant wireless IC device including a coil antenna with a large coil opening area and good electrical characteristics, such as a low direct current resistance, is easily manufactured. In addition, in the above-described manufacturing methods, metal posts with a small diameter are able to be used in the manufacture of the coil antenna, and a coil antenna with a large winding number and a high inductance is able to be manufactured.

In a preferred embodiment of the present invention, the post mounting step may include a step of forming holes that extend in the normal direction to the base in the resin member, and then inserting the first metal post and the second metal post into the holes.

In a preferred embodiment of the present invention, the coating step may include a step of coating the base with a semi-hardened resin member, and the post mounting step may include a step of inserting the first metal post and the second metal post into the semi-hardened resin member, and then hardening the semi-hardened resin member.

In a preferred embodiment of the present invention, the coating step may include a step of grinding or cutting the resin member together with the first metal post and the second metal post in a planar manner.

In a preferred embodiment of the present invention, the post mounting step may include a step of grinding or cutting the resin member together with the first metal post and the second metal post in a planar manner.

In a preferred embodiment of the present invention, the removing step may include a step of grinding or cutting the resin member together with the substrate, the base, the first metal post, and the second metal post in a planar manner.

According to various preferred embodiments of the present invention, a wireless IC device that includes a coil antenna having good electrical characteristics, such as a low direct current resistance, and that is durable and highly heat resistant is realized. In addition, a wireless IC device including a coil antenna having a high flexibility of design with which there is substantially no limitation regarding the dimension in the direction of the coil winding axis and the coil opening area is easily obtained. In addition, a molded resin article including such a wireless IC device is also easily obtained.

According to methods for manufacturing a wireless IC device according to preferred embodiments of the present invention, durable, highly heat resistant wireless IC devices including a coil antenna with a large coil opening area and good electrical characteristics, such as a low direct current resistance, are easily manufactured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
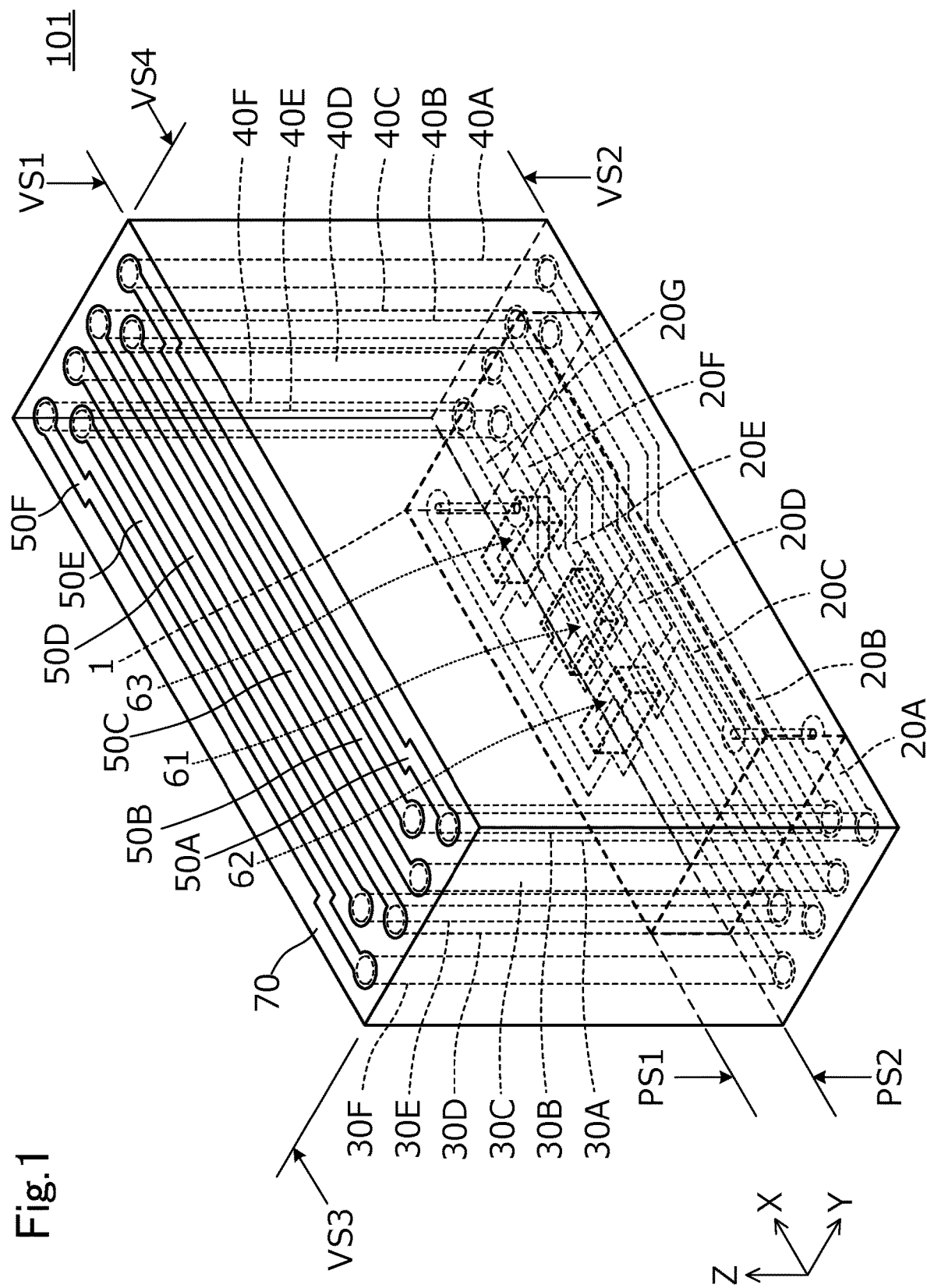
FIG. 1 is a perspective view of a chip-type wireless IC device 101 according to a first preferred embodiment of the present invention.

Preferred embodiments of the present invention will now be described with reference to the drawings by way of examples. In the drawings, the same portions are denoted by the same reference numerals. In the second and the following preferred embodiments, descriptions that are the same as those in the first preferred embodiment will be omitted, and differences will be described. In particular, descriptions of similar effects achieved by similar structures will not be repeated in each preferred embodiment.

First Preferred Embodiment

Figure 2A:
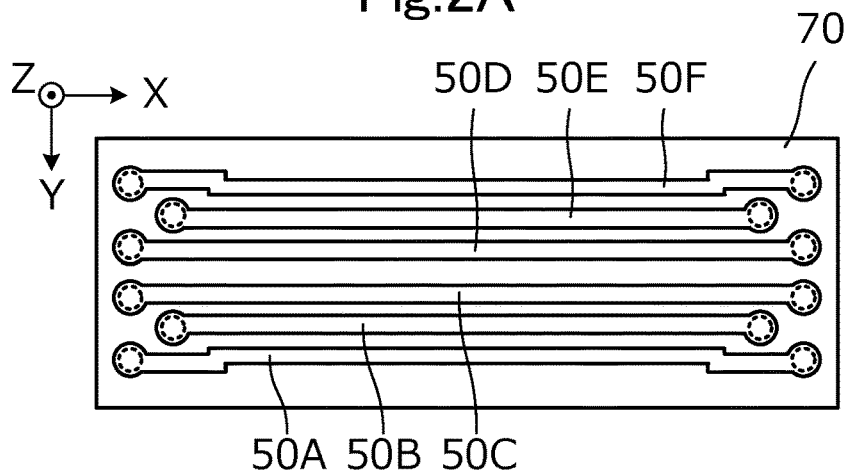
FIG. 2A is a plan view of the wireless IC device 101.
Figure 2B:
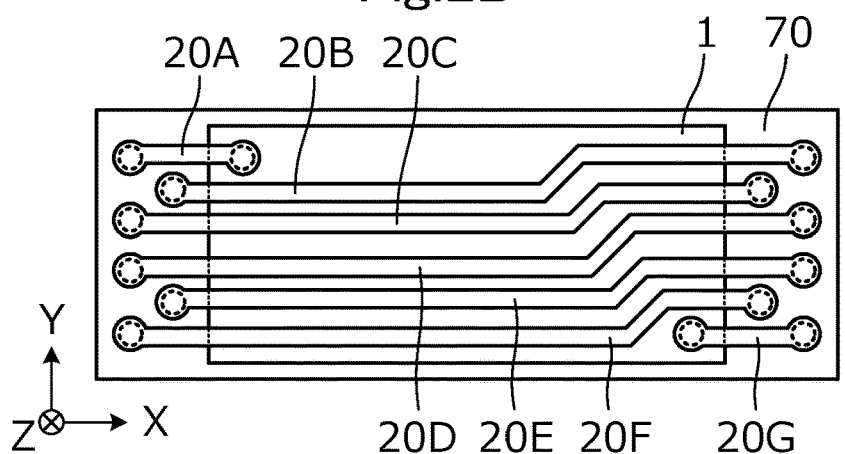
FIG. 2B is a bottom view of the wireless IC device 101.
Figure 2C:
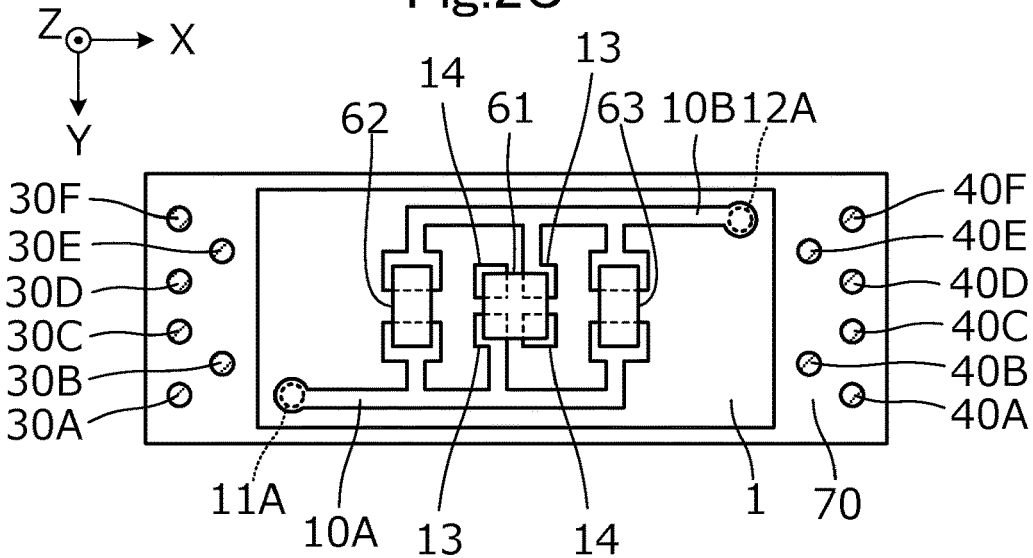
FIG. 2C is a plan view of a substrate 1 (view of a first principal surface PS1).

FIG. 1 is a perspective view of a chip-type wireless IC device 101 according to a first preferred embodiment. FIG. 2A is a plan view of the wireless IC device 101, FIG. 2B is a bottom view of the wireless IC device 101, and FIG. 2C is a plan view of a substrate 1 (view of a first principal surface PS1).

The wireless IC device 101 includes a resin member 70, the substrate 1, which is plate-shaped and includes the first principal surface PS1 and a second principal surface PS2, a coil antenna (described in detail below), and an RFIC element 61.

As illustrated in FIG. 1 and other drawings, the resin member 70 preferably has a rectangular parallelepiped shape having a longitudinal direction that coincides with the X-axis direction of an orthogonal X-Y-Z coordinate system, for example. The resin member 70 includes a first surface VS1, a second surface VS2 that faces the first surface VS1, and a first side surface VS3 and a second side surface VS4 that are connected to the first surface VS1 and the second surface VS2. The substrate is a plate having a rectangular or substantially rectangular shape in plan view. The substrate 1 is, for example, a printed wiring board, and is typically a double-sided through-hole substrate. Wiring conductor patterns 10A and 10B and NC terminals 14 are provided on the first principal surface PS1 of the substrate 1. The wiring conductor patterns 10A and 10B and the NC terminals 14 are formed by, for example, etching a Cu foil.

The first principal surface PS1 of the substrate 1 is parallel or substantially parallel to the first surface VS1 of the resin member 70. The area of the first principal surface PS1 of the substrate 1 is smaller than the area of the first surface VS1 of the resin member 70. The area of the second principal surface PS2 of the substrate 1 is smaller than the area of the second surface VS2 of the resin member 70. As illustrated in FIG. 1 and other figures, the substrate 1 is embedded in the resin member 70 so that the second principal surface PS2 is exposed and the first principal surface PS1 and side surfaces are in contact with the resin member 70. In addition, as illustrated in FIG. 1, the substrate 1 is embedded in the resin member 70 so that the second principal surface PS2 of the substrate 1 and the second surface VS2 of the resin member 70 are flush with each other. First linear conductor patterns 20A, 20B, 20C, 20D, 20E, 20F, and 20G are provided on the second principal surface PS2 of the substrate 1 and the second surface VS2 of the resin member 70, which are flush with each other.

The substrate 1 includes interlayer connection conductors 11A and 12A. The interlayer connection conductors 11A and 12A are interlayer conductors that connect the first principal surface PS1 and the second principal surface PS2 of the substrate 1 to each other, and include through holes. The first linear conductor pattern 20A and the wiring conductor pattern 10A are electrically connected to each other by the interlayer connection conductor 11A, and the first linear conductor pattern 20G and the wiring conductor pattern 10B are electrically connected to each other by the interlayer connection conductor 12A. More specifically, the first linear conductor pattern 20A is connected to the wiring conductor pattern 10A, which includes a power supply terminal 13, in series, and the first linear conductor pattern 20G is connected to the wiring conductor pattern 10B, which also includes a power supply terminal 13, in series. Although the interlayer connection conductors 11A and 12A may be through-hole-type interlayer conductors as described above, they may instead be end-surface-type interlayer conductors formed by, for example, applying conductors on the end surfaces of the substrate, or via-hole type interlayer conductors formed by forming through holes in the substrate and filling the through holes with conductive paste or the like.

The wireless IC device 101 also includes first metal posts 30A, 30B, 30C, 30D, 30E, and 30F and second metal posts 40A, 40B, 40C, 40D, 40E, and 40F. These metal posts are pillar-shaped metal bodies. More specifically, each of the first metal posts 30A, 30B, 30C, 30D, 30E, and 30F and the second metal posts 40A, 40B, 40C, 40D, 40E, and 40F is, for example, a columnar pin made of Cu, and is formed by, for example, cutting a Cu wire having a circular cross section into pieces having a predetermined length. The cross-sectional shape is not limited to a circular shape. The aspect ratio (height/diameter of bottom surface) of the metal posts is preferably about 5 to about 30, for example, from the viewpoint of handleability.

The first metal posts 30A to 30F extend between the first surface VS1 and the second surface VS2 of the resin member in the normal direction to the second surface VS2 of the resin member 70. As illustrated in FIG. 1, the first metal posts 30A to 30F are disposed near the first side surface VS3 of the resin member 70. First ends of the first metal posts 30A to 30F are connected to the first linear conductor patterns 20A to 20F.

More specifically, the first end of the first metal post 30A is connected to the first linear conductor pattern 20A. The first end of the first metal post 30B is connected to the first linear conductor pattern 20B. The first end of the first metal post 30C is connected to the first linear conductor pattern 20C. The first end of the first metal post 30D is connected to the first linear conductor pattern 20D. The first end of the first metal post 30E is connected to the first linear conductor pattern 20E. The first end of the first metal post 30F is connected to the first linear conductor pattern 20F.

The second metal posts 40A to 40F extend between the first surface VS1 and the second surface VS2 of the resin member in the normal direction to the second surface VS2 of the resin member 70. As illustrated in FIG. 1, the second metal posts 40A to 40F are disposed near the second side surface VS4 of the resin member 70. First ends of the second metal posts 40A to 40F are connected to the first linear conductor patterns 20B to 20G.

More specifically, the first end of the second metal post 40A is connected to the first linear conductor pattern 20B. The first end of the second metal post 40B is connected to the first linear conductor pattern 20C. The first end of the second metal post 40C is connected to the first linear conductor pattern 20D. The first end of the second metal post 40D is connected to the first linear conductor pattern 20E. The first end of the second metal post 40E is connected to the first linear conductor pattern 20F. The first end of the second metal post 40F is connected to the first linear conductor pattern 20G.

The wireless IC device 101 also includes second linear conductor patterns 50A, 50B, 50C, 50D, 50D, 50E, and 50F formed on the first surface VS1 of the resin member 70. First ends of the second linear conductor patterns 50A to 50F are connected to second ends of the first metal posts 30A to 30F, and second ends of the second linear conductor patterns 50A to 50F are connected to second ends of the second metal posts 40A to 40F.

More specifically, the first end of the second linear conductor pattern 50A is connected to the second end of the first metal post 30A, and the second end of the second linear conductor pattern 50A is connected to the second end of the second metal post 40A. The first end of the second linear conductor pattern 50B is connected to the second end of the first metal post 30B, and the second end of the second linear conductor pattern 50B is connected to the second end of the second metal post 40B. The first end of the second linear conductor pattern 50C is connected to the second end of the first metal post 30C, and the second end of the second linear conductor pattern 50C is connected to the second end of the second metal post 40C. The first end of the second linear conductor pattern 50D is connected to the second end of the first metal post 30D, and the second end of the second linear conductor pattern 50D is connected to the second end of the second metal post 40D. The first end of the second linear conductor pattern 50E is connected to the second end of the first metal post 30E, and the second end of the second linear conductor pattern 50E is connected to the second end of the second metal post 40E. The first end of the second linear conductor pattern 50F is connected to the second end of the first metal post 30F, and the second end of the second linear conductor pattern 50F is connected to the second end of the second metal post 40F.

Thus, in the wireless IC device 101, the number of first linear conductor patterns 20A to 20G, the number of second linear conductor patterns 50A to 50F, the number of first metal posts 30A to 30F, and the number of second metal posts 40A to 40F are more than one.

The first linear conductor patterns 20A to 20G extend in the X-axis direction of the orthogonal X-Y-Z coordinate system, and the second linear conductor patterns 50A to 50F also extend in the X-axis direction of the orthogonal X-Y-Z coordinate system. Here, the expression "extend in the X-axis direction" is not limited to the case in which all of the first linear conductor patterns 20A to 20G and the second linear conductor patterns 50A to 50F are parallel or substantially parallel to each other, and includes the case in which the first linear conductor patterns 20A to 20G and the second linear conductor patterns 50A to 50F extend in a direction that is roughly the same as the X-axis direction, that is, substantially in the X-axis direction.

The first metal posts 30A to 30F are arranged in the Y-axis direction of the orthogonal X-Y-Z coordinate system, and extend in the Z-axis direction of the orthogonal X-Y-Z coordinate system. Similarly, the second metal posts 40A, 40B, 40C, 40D, 40E, and 40F are arranged in the Y-axis direction of the orthogonal X-Y-Z coordinate system, and extend in the Z-axis direction of the orthogonal X-Y-Z coordinate system. Accordingly, these metal posts are parallel or substantially parallel to each other.

In the wireless IC device 101 according to the present preferred embodiment, the side portions of the first metal posts 30A to 30F and the second metal posts 40A to 40F having a columnar shape are preferably embedded in the first side surface VS3 and the second side surface VS4. However, the structure is not limited to this. The side portions of the first metal posts 30A to 30F and the second metal posts 40A to 40F may be partially exposed at the first side surface VS3 and the second side surface VS4 of the resin member 70.

The first linear conductor patterns 20A to 20G, the first metal posts 30A to 30F, the second linear conductor patterns 50A to 50F, and the second metal posts 40A to 40F preferably define a six-turn helical coil antenna, for example. As illustrated in FIG. 1, the coil openings of the coil antenna have a rectangular or substantially rectangular shape having a longitudinal direction that coincides with the X-axis direction of the orthogonal X-Y-Z coordinate system.

In the present preferred embodiment, the main body of the wireless IC device 101, which includes the resin member 70 and the substrate 1, preferably has a rectangular or substantially rectangular parallelepiped shape having a longitudinal direction that coincides with the X-axis direction of the orthogonal X-Y-Z coordinate system, for example. The area of the end surfaces in the coil axis direction (both end surfaces in the Y-axis direction) of the main body is greater than that of the first surface VS1 and the second surface VS2 (both end surfaces in the Z-axis direction in FIG. 1).

The RFIC element 61, in which an RFIC chip (bare chip) is packaged, is connected (mounted) to the power supply terminal of the wiring conductor pattern 10A and the power supply terminal 13 of the wiring conductor pattern 10B. As illustrated in FIG. 1, the RFIC element 61 is mounted on the first principal surface PS1 of the substrate 1, and is embedded in the resin member 70. The RFIC element 61 may be a bare-chip-type RFIC chip. In such a case, the RFIC chip includes Au electrode terminals, which are connected to Au plating films on the power supply terminals 13 by ultrasonic bonding. The RFIC chip may instead be connected to the power supply terminals 13 (land patterns) by wires.

In addition to the RFIC element 61, chip capacitors 62 and 63 are also mounted on the substrate 1 in the wireless IC device 101. Similar to the RFIC element 61, the chip capacitors 62 and 63 are also connected to the wiring conductor pattern 10A and the wiring conductor pattern 10B, and are mounted on the first principal surface PS1 of the substrate 1 and embedded in the resin member 70.

Figure 3:
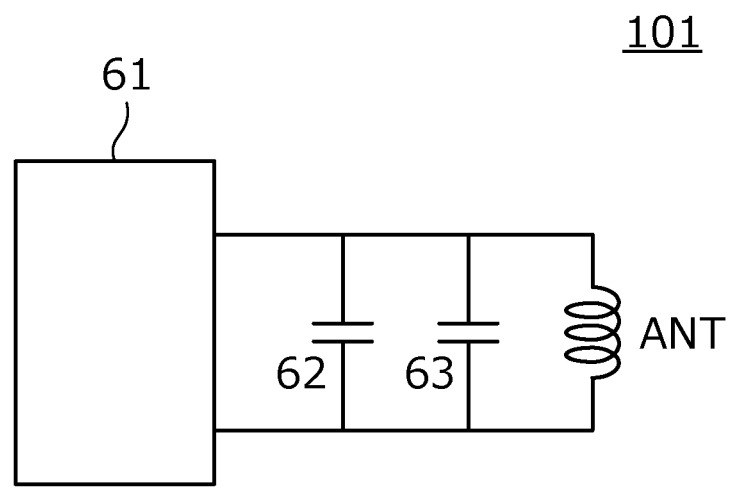
FIG. 3 is a circuit diagram of the wireless IC device 101.

FIG. 3 is a circuit diagram of the wireless IC device 101. The coil antenna ANT is connected to the RFIC element 61, and the chip capacitors 62 and 63 are connected to the coil antenna ANT in parallel. The coil antenna ANT, the chip capacitors 62 and 63, and the capacitance component of the RFIC element 61 define an LC resonant circuit. The capacitances of the chip capacitors 62 and 63 are selected so that the resonant frequency of the LC resonant circuit is equal or substantially equal to the communication frequency of the RFID system (for example, 13.56 MHz). One of the chip capacitors 62 and 63 is used for rough adjustment, and the other is used for fine adjustment. The number of capacitors for setting the resonant frequency may instead be one.

Here, an "RFIC element" may either be an RFIC chip or an RFIC package in which an RFIC chip is mounted on and integrated with a substrate having, for example, a matching circuit. Also, an "RFID tag" is defined as an information medium which includes an RFIC element and a coil antenna connected to the RFIC element and which performs non-contact reading and writing of data stored in an internal memory by using a radio wave (electromagnetic wave) or a magnetic field. Accordingly, the wireless IC device according to the present preferred embodiment defines and functions as an RFID tag.

The RFIC element 61 includes, for example, an HF-band high-frequency wireless IC chip for an HF-band RFID system. The wireless IC device 101 is provided on, for example, an article to be managed. When the wireless IC device 101 (that is, RFID tag) attached to the article is brought near a reader/writer device, magnetic field coupling of the coil antenna included in the wireless IC device 101 and a coil antenna included in the RFID reader/writer device occurs. Thus, RFID communication is carried out between the RFID tag and the reader/writer device.

The present preferred embodiment provides the following effects.

Since portions of the pattern of the coil antenna are defined by the metal posts, it is not necessary to form a coil in a multilayer substrate, and complex wiring is not required. With this structure, a coil structure that is relatively tall and in which the sizes of the coil openings are able to be freely designed can be easily realized. In addition, since the resistance of the coil antenna is able to be reduced, a wireless IC device having a high sensitivity or a wireless IC device that is small even though the sensitivity thereof is high is obtained.

Since the surface on which the RFIC element 61 is mounted is parallel or substantially parallel to the winding axis of the coil antenna (Y axis), the mounting electrodes (land patterns) of the RFIC element 61 do not easily impede the formation of a magnetic field by the coil antenna. In addition, adverse effects of the magnetic field formed by the coil antenna on the RFIC element 61 (malfunction, unstable operation, etc.) are small. In addition, adverse effects of the noise generated by a digital circuit unit included in the RFIC element 61 on the coil antenna (reduction in reception sensitivity, input of transmission signals to the reception circuit, etc.) are small.

Portions of the coil are defined by the metal posts, and the direct current resistance components of the metal posts are able to be made sufficiently lower than the DCR of a sintered metal body obtained by sintering conductive paste or a conductor film such as a thin metal body formed by etching a conductive thin film. Therefore, a coil antenna having a high Q value (low loss) is obtained.

As described in detail below, among the patterns that define the coil, the first linear conductor patterns 20A to 20G and the second linear conductor patterns 50A to 50F, which extend in the X-axis direction, are all able to be increased in thickness by forming a plating film made of, for example, Cu. Therefore, the direct current resistance component of the coil is further reduced.

Since the capacitors connected to the RFIC element are provided, a circuit to match the RFIC element and the coil antenna or to set the resonant frequency is able to be easily formed, and an external circuit is able to be omitted or simplified.

In this chip-type wireless IC device 101, the surface mount chip components, such as the RFIC element 61 and the chip capacitors 62 and 63, and the metal posts 30A to 30F and 40A to 40F are protected by the resin member 70. Therefore, the entirety of the wireless IC device is durable. In particular, when the wireless IC device is embedded in a molded resin article, solder connecting portions of the surface mount chip components are protected from high-temperature resin (for example, resin at a temperature of about 300° C. or more) that flows during injection molding. In addition, the RFIC element 61, the chip capacitors 62 and 63, etc., are disposed in the area surrounded by the metal posts 30A to 30F and 40A to 40F, the wiring conductor patterns 10A and 10B, the first linear conductor patterns 20A to 20G, etc., which are portions of the coil antenna, and are surrounded by the resin member 70 and the substrate 1. With this structure, a large thermal load is not easily applied to connecting portions between the surface mount chip components (RFIC element 61 and chip capacitors 62 and 63) and, for example, the power supply terminals 13 (wiring conductor patterns 10A and 10B), and to the surface mount devices. Accordingly, even when the wireless IC device 101 is embedded in a molded resin object (toy, container, etc.), sufficient operational reliability of the surface mount chip components is able to be ensured, and the reliability of the connecting portions between the surface mount devices and the power supply terminals 13 (wiring conductor patterns 10A and 10B) is able to be increased. Thus, a highly heat-resistant wireless IC device that is able to be disposed in a molded resin article, in other words, that is resistant to high temperature during injection molding, is realized. Even when the solder bonding portions are melted once at a high temperature, since the resin member 70 and the substrate 1 are bonded together by the adhesion between the resins, the mounting components and the metal posts are not detached or deformed. Therefore, the bonding state of the solder bonding portions returns to the normal state after the solder bonding portions are cooled. As a result, the inductance value of the coil antenna is able to be maintained.

Since the surface mount chip components, such as the RFIC element 61 and the chip capacitors 62 and 63, are disposed in the coil antenna, the entirety of the wireless IC device is durable. In particular, since the RFIC element 61 is able to be easily arranged so as not to be exposed to the outside of the wireless IC device 101, the function of protecting the RFIC element 61 is improved, and an increase in size that occurs when the RFIC element 61 is mounted on the exterior is prevented.

Since the first linear conductor patterns 20A to 20G and the second linear conductor patterns 50A to 50F are able to be formed by performing patterning on surfaces of the resin member 70 and a surface of the substrate 1, the first linear conductor patterns 20A to 20G and the second linear conductor patterns 50A to 50F are easily formed. In addition, the first linear conductor patterns 20A to 20G are able to be easily connected to the first metal posts 30A to 30F and the second metal posts 40A to 40F, and the second linear conductor patterns 50A to 50F are also able to be easily connected to the first metal posts 30A to 30F and the second metal posts 40A to 40F. Furthermore, the interlayer conductors of the substrate are able to be easily connected to the first linear conductor patterns. Since the metal posts define relatively tall conductors, the number of connecting locations is smaller than that in the case where, for example, conductors extending in the height direction are formed by laminating a plurality of base layers having interlayer conductors. Accordingly, the electrical reliability of the coil antenna is able to be increased.

In the wireless IC device 101, the substrate 1 is embedded in the resin member 70 so that the second principal surface PS2 of the substrate 1 and the second surface VS2 of the resin member 70 are flush with each other, and the first linear conductor patterns 20A and 20G extend over both the second principal surface PS2 of the substrate 1 and the second surface VS2 of the resin member 70. Accordingly, the interlayer conductors 11A and 12A of the substrate 1 are able to be easily connected to the first linear conductor patterns 20A and 20G, and the reliability of the connection between the interlayer conductors 11A and 12A of the substrate 1 and the first linear conductor patterns 20A and 20G is increased.

Since the metal posts (first metal posts 30A to 30F and second metal posts 40A to 40F) are not mounted on the substrate 1, it is not necessary to form lands to mount the metal posts on the substrate 1, and the metal posts are able to be arranged at a small pitch. Therefore, the size can be made small even when the number of turns is large (in other words, even when the number of metal posts is increased).

In addition, the first linear conductor patterns 20B to 20F connect the first ends of the first metal posts 30B to 30F to the first ends of the second metal posts 40A to 40E through a region that overlaps the second principal surface PS2 of the substrate 1 when viewed in the Z-axis direction. Accordingly, a bridge pattern (jumper wiring) is able to be formed by using the second principal surface PS2, which is at a side opposite to the first principal surface PS1 on which the RFIC element 61 is mounted.

The RFIC element 61 of the wireless IC device 101 is connected to the interlayer conductors 11A and 12A by the wiring conductor patterns 10A and 10B on the first principal surface PS1 of the substrate 1. Therefore, the above-described bridge pattern is easily formed. The RFIC element 61 may instead be directly connected to the interlayer conductors 11A and 12A. However, when the RFIC element 61 is connected to the interlayer conductors 11A and 12A by the wiring conductor patterns 10A and 10B for routing, the interlayer conductors 11A and 12A may be formed so as to extend to any positions on the second principal surface PS2 of the substrate 1.

The power supply terminals 13 are provided on the wiring conductor patterns 10A and 10B, and the RFIC element 61 is connected to the power supply elements. Therefore, the RFIC element 61 and the mounting electrodes do not easily impede the formation of a magnetic field by the coil antenna, and interference between the coil antenna and the RFIC element 61 is significantly reduced or minimized.

Figure 4:
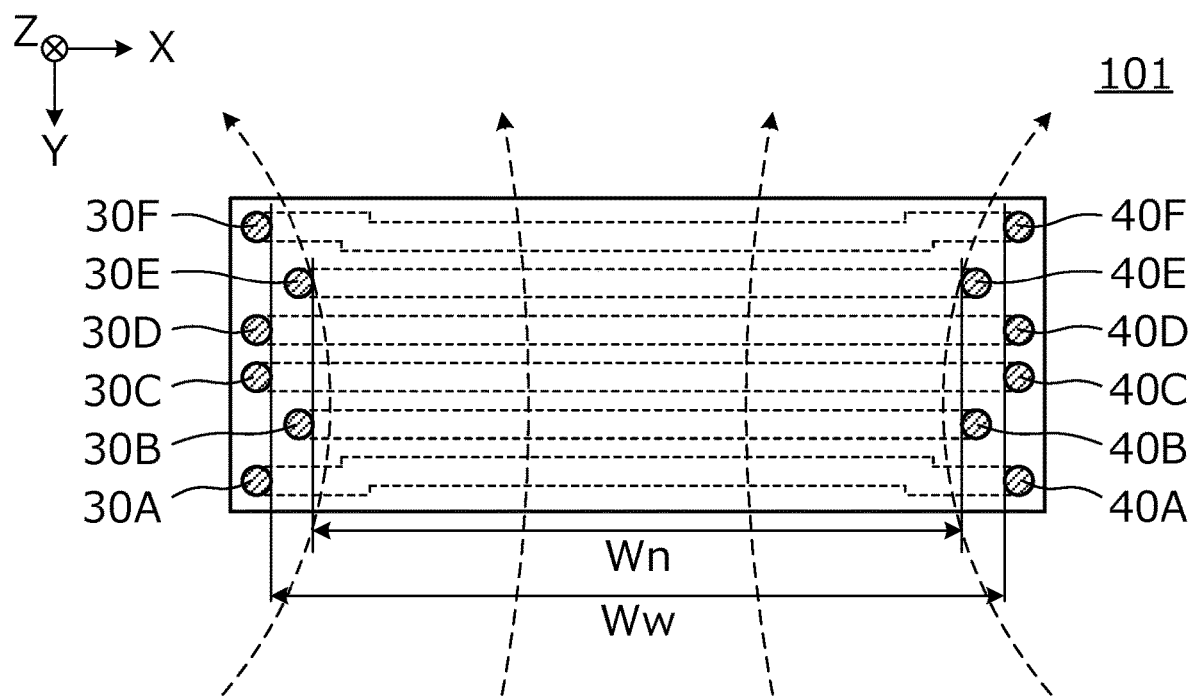
FIG. 4 is a cross-sectional view of the wireless IC device 101 at the middle height of metal posts.
Figure 5:
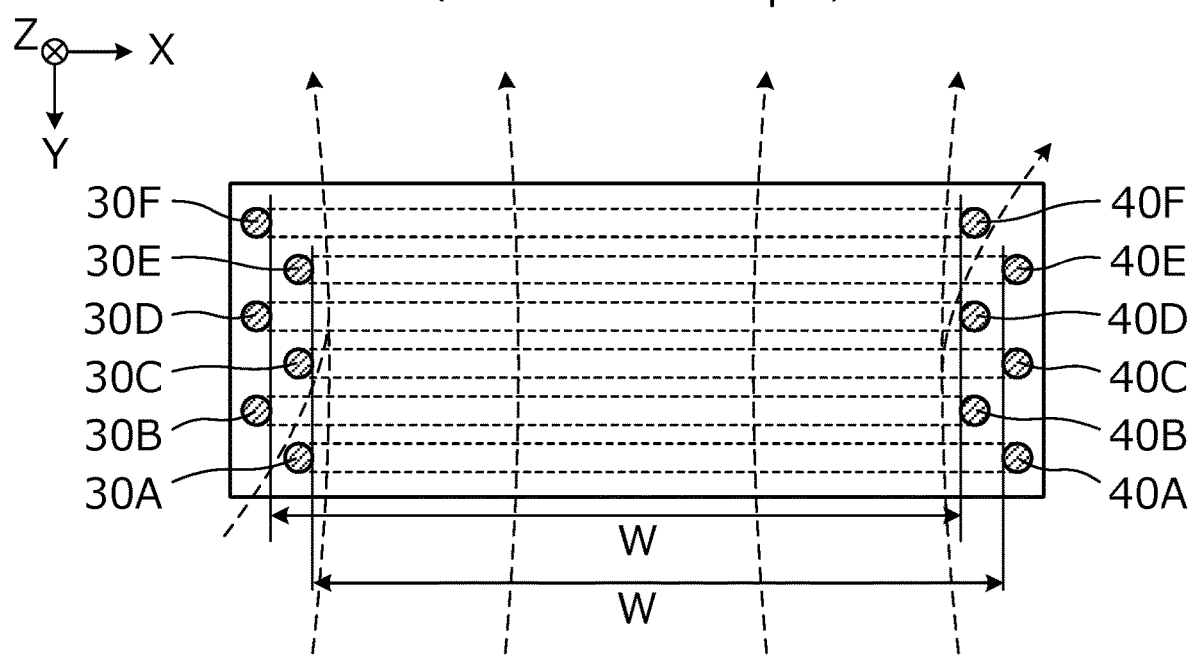
FIG. 5 is a cross-sectional view of a wireless IC device according to a reference example at the middle height of metal posts.

FIG. 4 is a cross-sectional view of the wireless IC device 101 at the middle height of the metal posts 30A to 30F and 40A to 40F. FIG. 5 is a cross-sectional view of a wireless IC device according to a reference example at the middle height of metal posts 30A to 30F and 40A to 40F. The difference between the wireless IC device 101 according to the present preferred embodiment and the wireless IC device according to the reference example is the arrangement of the metal posts 30A to 30F and 40A to 40F.

In each of the wireless IC device 101 according to the present preferred embodiment and the wireless IC device according to the reference example, the first metal posts 30A to 30F and the second metal posts 40A to 40F are arranged in the Y-axis direction and are disposed in a staggered pattern when viewed in the Z-axis direction. In the wireless IC device 101 according to the present preferred embodiment, the helical coil includes two types of loops having different inner diameters. As illustrated in FIG. 4, the loop including the first metal post 30A and the second metal post 40A, the loop including the first metal post 30C and the second metal post 40C, the loop including the first metal post 30D and the second metal post 40D, and the loop including the first metal post 30F and the second metal post 40F each have an opening width of Ww. In addition, the loop including the first metal post 30B and the second metal post 40B and the loop including the first metal post 30E and the second metal post 40E each have an opening width of Wn. Here, Wn<Ww is satisfied. In contrast, in the wireless IC device according to the reference example, as illustrated in FIG. 5, all loops have an opening width of W.

In the wireless IC device 101 according to the present preferred embodiment, the two loops at the opening surfaces of the helical coil antenna (the loop including the first metal post 30A and the second metal post 40A and the loop including the first metal post 30F and the second metal post 40F) belong to one of the two types of loops that has a larger inner diameter.

More specifically, assume that "first loop" is the loop including the first metal post 30A, which is one of the first metal posts 30A to 30F that is at a first end in the Y-axis direction, and the second metal post 40A, which is one of the second metal posts 40A to 40F that is at the first end in the Y-axis direction, and "second loop" is the loop including the first metal post 30F, which is one of the first metal posts 30A to 30F that is at a second end in the Y-axis direction, and the second metal post 40F, which is one of the second metal posts 40A to 40F that is at the second end in the Y-axis direction. In this case, the inner diameter of the first loop and the second loop is the inner diameter of one of the two types of loops that has a larger inner diameter.

In FIGS. 4 and 5, the dashed lines conceptually indicate the magnetic flux that passes through the helical coil antenna. In the reference example, the practical inner diameter of the two loops at the opening surfaces of the helical coil antenna is smaller than the opening width W of the loops. In addition, the magnetic flux easily leaks from the gaps between the adjacent metal posts. According to the present preferred embodiment, the inner diameter of the two loops at the opening surfaces of the helical coil antenna is the inner diameter of one of the two types of loops that has a larger inner diameter. Therefore, the practical coil openings of the coil antenna through which the magnetic flux passes are larger than those in the reference example. In addition, the magnetic flux does not easily leak from the gaps between the adjacent metal posts. Therefore, magnetic field coupling between the coil antenna and an antenna that communicates with the coil antenna is able to be provided with a relatively large distance therebetween. Thus, when a helical coil antenna having three or more turns is provided, the metal posts are preferably arranged so that the loop area at both ends in the coil axis direction is large.

The above-described helical coil may include three or more types of loops having different inner diameters, for example. In such a case, the inner diameter of the two loops at the opening surfaces of the coil antenna may be the inner diameter of one of the three or more types of loops that has the largest inner diameter.

The above-described structure illustrated in FIG. 4 has the following effects.

Since the practical opening diameter of the coil antenna is large, the coil antenna is capable of communicating with another antenna with a relatively large distance therebetween.

Since the first metal posts and the second metal posts are disposed in a staggered pattern along the arrangement direction at least in end portions in the coil axis direction, the size is able to be small even when the number of turns is large (in other words, even when the number of metal posts is increased).

Figure 6:
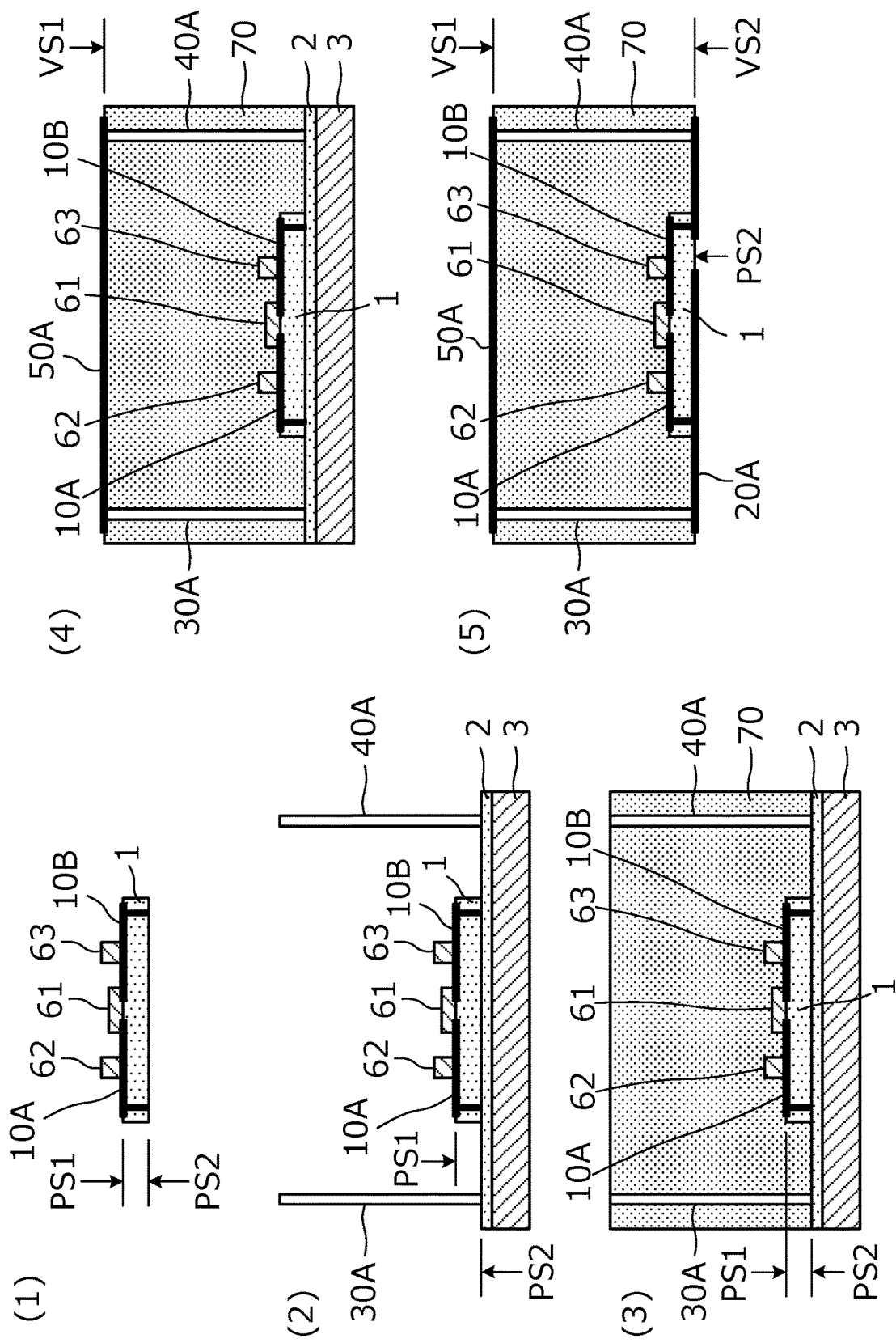
FIG. 6 is sectional view illustrating successive manufacturing steps of the wireless IC device 101.

The wireless IC device 101 according to the present preferred embodiment is manufactured by, for example, the steps described below. FIG. 6 is sectional view illustrating successive manufacturing steps of the wireless IC device 101.

First, as illustrated in part (1) of FIG. 6, the substrate 1 is prepared. More specifically, the wiring conductor patterns 10A and 10B, lands to mount the RFIC element (power supply terminals 13 and NC terminals 14), lands to mount the chip capacitors, and a routing pattern to connect these lands to each other are provided on the first principal surface PS1 of the substrate 1. In addition, the interlayer connection conductors to connect the wiring conductor patterns 10A and 10B to the first linear conductor patterns 20A and 20G are provided in the thickness direction of the substrate 1 (see FIGS. 2B and 2C). At this time, no conductor patterns are provided on the second principal surface of the substrate 1.

Next, the RFIC element 61 and the chip capacitors 62 and 63 are mounted on the wiring conductor patterns 10A and 10B of the substrate 1 by using a conductive bonding material, such as solder. More specifically, when solder is used, solder paste is applied to the electrodes (wiring conductor patterns 10A and 10B) on the first principal surface PS1 of the substrate 1 by printing, and the components are mounted by using a mounter. Then, the components are soldered by a reflow process. With this structure, the RFIC element 61 and the chip capacitors 62 and 63 are electrically connected to the substrate 1, and are structurally bonded to the substrate 1.

The substrate 1 is, for example, a printed wiring board that is a glass-epoxy substrate, a resin substrate, or the like. The wiring conductor patterns and lands on the first principal surface PS1 of the substrate 1 are preferably formed by performing patterning on a copper foil. The substrate 1 may instead be a ceramic substrate on which a thick film pattern is formed. The interlayer connection conductors are, for example, through holes extending through the substrate 1 and having inner walls to which plating films are applied.

The wiring conductor patterns 10A and 10B have, for example, a thickness of about 18 μm and a width of about 100 μm in cross section. After the wiring conductor patterns 10A and 10B are formed, they are preferably plated with Cu or the like so that the total thickness is increased to, for example, about 40 μm to about 50 μm.

The RFIC element 61 is formed by mounting an RFIC chip for an RFID tag on a ceramic substrate and packaging the RFIC chip. The chip capacitors 62 and 63 are, for example, multilayer ceramic chip components.

Next, as illustrated in part (2) of FIG. 6, the substrate 1 and the metal posts 30A to 30F and 40A to 40F are mounted on an adhesive layer 2 of a base 3 having the adhesive layer 2. The substrate 1 is mounted on the base 3 such that the second principal surface PS2 thereof faces the adhesive layer 2. The metal posts 30A to 30F and 40A to 40F are mounted in a standing position with the first ends thereof facing the base 3. With this structure, the substrate 1 and the metal posts 30A to 30F and 40A to 40F are mounted on the base 3 in a securely fixed state.

The adhesive layer 2 is made of, for example, an adhesive resin. Each of the metal posts 30A to 30F and 40A to 40F is a post made of Cu. These metal posts have, for example, a columnar shape with a diameter of about 0.3 mm and a length of about 7 mm. Although the material of the metal posts is not limited to those containing Cu as the main component, a material containing Cu as the main component is preferably used from the viewpoint of conductivity and workability.

Next, as illustrated in part (3) of FIG. 6, the resin member 70 is formed (resin is applied) so that the resin member 70 has the same height as that of the metal posts 30A to 30F and 40A to 40F (height such that at least the RFIC element 61 and the substrate 1 are embedded). More specifically, epoxy resin or the like is applied to a predetermined height (height greater than or equal to that of the metal posts 30A to 30F and 40A to 40F), and then the surface of the resin member 70 is ground (or cut) in a planar manner so that head portions of the metal posts 30A to 30F and 40A to 40F are exposed. Alternatively, epoxy resin or the like may be applied to a predetermined height (height less than or equal to that of the metal posts), and then the resin member 70 may be ground (or cut) in a planar manner together with the metal posts so that head portions of the metal posts are exposed at the surface of the resin member 70.

The resin member 70 may be formed either by applying liquid resin or by stacking a semi-hardened resin sheet.

Next, as illustrated in part (4) of FIG. 6, the second linear conductor patterns 50A to 50F are formed on the surface of the resin member 70. More specifically, a conductor film, such as a Cu film, is formed on the first surface VS1 of the resin member 70, at which the head portions of the metal posts 30A to 30F and 40A to 40F are exposed, by plating or the like. Then, patterning is performed on the conductor film by forming a photoresist film and performing etching. The second linear conductor patterns 50A to 50F may instead be formed by screen printing by using conductive paste. Thus, the second linear conductor patterns 50A to 50F are connected to the metal posts 30A to 30F and 40A to 40F.

Next, as illustrated in part (5) of FIG. 6, the base 3 having the adhesive layer 2 is removed from the resin member 70, and the first linear conductor patterns 20A to 20G are formed on the second surface VS2 of the resin member 70 and the second principal surface PS2 of the substrate 1.

More specifically, the base 3 is removed from the second surface VS2 of the resin member 70 and the second principal surface PS2 of the substrate 1, and the resin member is ground (or cut) in a planar manner (together with the adhesive layer 2 and the substrate 1) from the second-surface-VS2 side so that head portions of the metal posts 30A to 30F and 40A to 40F and the interlayer connection conductors 11A and 12A are exposed. After that, a conductor film, such as a Cu film, is formed on the second surface VS2 of the resin member 70 and the second principal surface PS2 of the substrate 1, at which the interlayer connection conductors 11A and 12A and the head portions of the metal posts 30A to 30F and 40A to 40F are exposed, by plating. Then, patterning is performed on the conductor film by using photoresist and performing etching. The first linear conductor patterns 20A to 20G may instead be formed by screen printing by using conductive paste. Thus, the first linear conductor patterns 20A to 20G are connected to the metal posts 30A to 30F and 40A to 40F and the wiring conductor patterns 10A and 10B.

After that, a plating film made of Cu or the like is preferably formed on the first linear conductor patterns 20A to 20G and the second linear conductor patterns 50A to 50F. In the case where a Cu plating film is formed, an Au plating film may be additionally formed on the surface of the plating film made of Cu or the like. Accordingly, the first linear conductor patterns 20A to 20G and the second linear conductor patterns 50A to 50F are increased in thickness, and the DCR thereof is reduced, so that the conductor loss is able to be reduced. Thus, the DCR of the first linear conductor patterns 20A to 20G and the second linear conductor patterns 50A to 50F is able to be reduced to a value that is about as small as the DCR of the metal posts 30A to 30F and 40A to 40F. More specifically, since the first linear conductor patterns and the second linear conductor patterns are exposed at the outer surface of a body in this stage, the thickness of the first linear conductor patterns and the second linear conductor patterns is able to be selectively increased (the thickness of the first linear conductor patterns is able to be increased relative to the thickness of the wiring conductor pattern) by immersing the body in a plating solution.

After that, anti-oxidation protective resin films (solder resist films or the like) are formed on the surfaces of the first linear conductor patterns 20A to 20G on the outer surface of the substrate 1 (second principal surface PS2) and the second linear conductor patterns 50A to 50F as necessary.

The above-described steps are performed on a mother substrate. Lastly, the mother substrate is divided to separate individual wireless IC devices (pieces) from each other.

Figure 7:
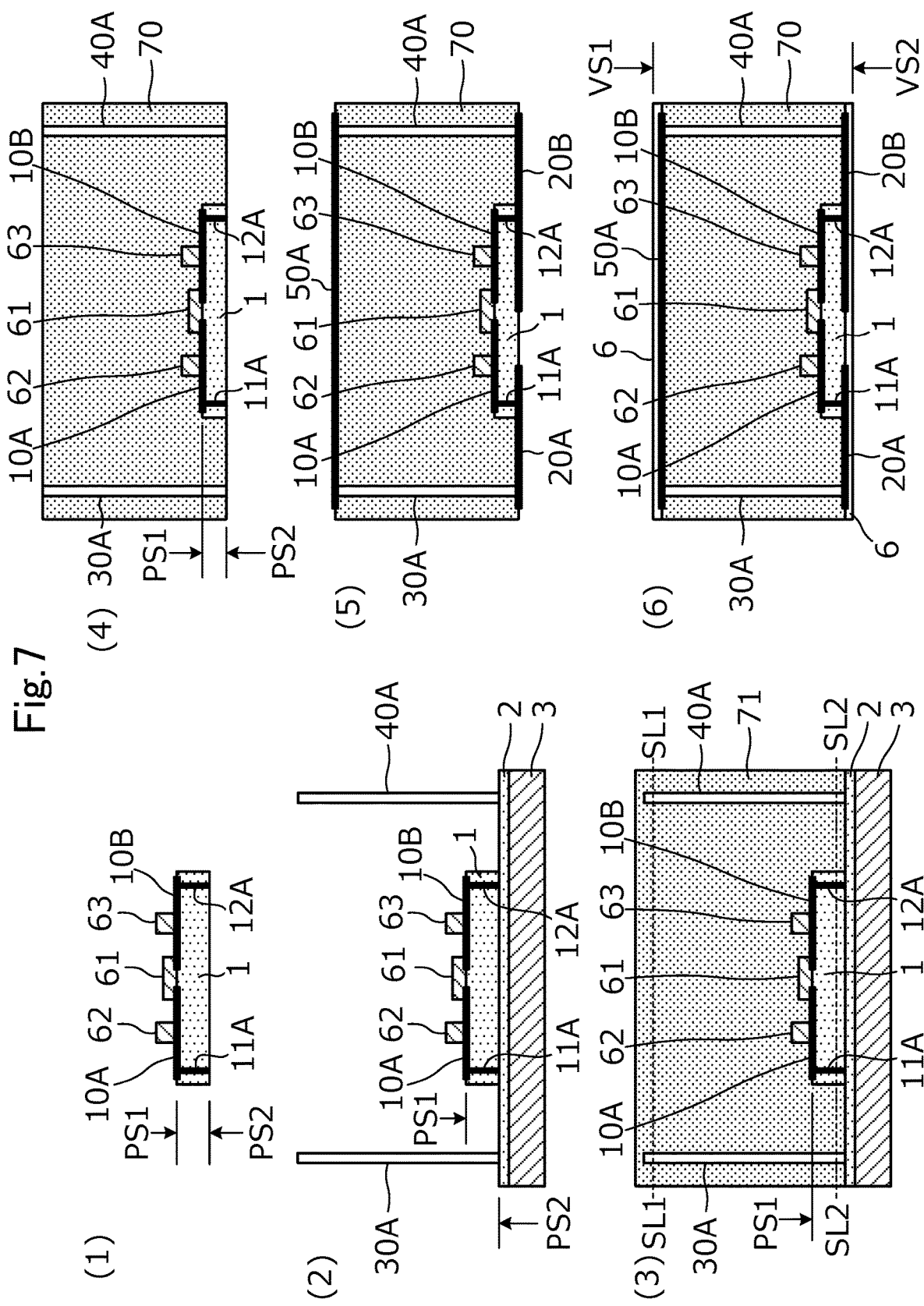
FIG. 7 is sectional view illustrating successive manufacturing steps of the wireless IC device 101 that are different from the manufacturing steps illustrated in FIG. 6.

The wireless IC device 101 may instead be manufactured by, for example, the steps described below. FIG. 7 is sectional view illustrating successive manufacturing steps of the wireless IC device 101 that are different from the manufacturing steps illustrated in FIG. 6.

First, as illustrated in part (1) of FIG. 7, the substrate 1 on which the RFIC element 61, the chip capacitors 62 and 63, etc., are mounted is prepared. The RFIC element 61 and the chip capacitors 62 and 63 are mounted on the wiring conductor patterns 10A and 10B of the substrate 1 by using a conductive bonding material, such as solder.

The wiring conductor patterns 10A and 10B, lands (power supply terminals 13, NC terminals 14 and lands to mount the chip capacitors), a routing pattern, and the interlayer connection conductors (through holes) are formed on the substrate 1.

Next, as illustrated in part (2) of FIG. 7, the substrate 1 and the metal posts 30A to 30F and 40A to 40F are mounted on an adhesive layer 2 of a base 3 having the adhesive layer 2. The substrate 1 is mounted on the base 3 such that the second principal surface PS2 thereof faces the adhesive layer 2. The metal posts 30A to 30F and 40A to 40F are mounted in a standing position with the first end sides thereof facing the base 3. With this structure, the substrate 1 and the metal posts 30A to 30F and 40A to 40F are mounted on the base 3 in a securely fixed state.

Next, as illustrated in part (3) of FIG. 7, the resin member 70 is formed on (resin is applied to) the base 3 so that the resin member 70 has a height that is greater than or equal to that of the metal posts 30A to 30F and 40A to 40F (height such that at least the RFIC element 61 and the substrate 1 are embedded).

Next, as illustrated in part (4) of FIG. 7, the base 3 is removed from the resin member 70, and head portions of the metal posts 30A to 30F and 40A to 40F and the interlayer connection conductors 11A and 12A are exposed at the surface of the resin member 70.

More specifically, the resin member 70 is formed so that the height thereof is greater than or equal to the height of the metal posts 30A to 30F and 40A to 40F, and is ground (or cut) in a planar manner (together with the metal posts 30A to 30F and 40A to 40F) to the grinding line SL1 illustrated in part (3) of FIG. 7. Accordingly, head portions of the metal posts 30A to 30F and 40A to 40F are exposed at the surface of the resin member 70. The height of the resin member 70 formed on the base 3 may instead be less than or equal to the height of the metal posts 30A to 30F and 40A to 40F. The resin member 70 is also ground (or cut) in a planar manner, together with the base 3, the substrate 1, and the metal posts, to the grinding line SL2 illustrated in part (3) of FIG. 7. Accordingly, head portions of the metal posts 30A to 30F and 40A to 40F and the interlayer connection conductors 11A and 12A are exposed at the surface of the resin member 70.

Next, as illustrated in part (5) of FIG. 7, the second linear conductor patterns 50A to 50F are formed on the first surface VS1 of the resin member 70, and the first linear conductor patterns 20A to 20G are formed on the second surface VS2 of the resin member 70 and the second principal surface PS2 of the substrate 1. After that, a plating film made of Cu or the like is formed on the first linear conductor patterns 20A to 20G and the second linear conductor patterns 50A to 50F.

Next, as illustrated in part (6) of FIG. 7, anti-oxidation protective resin films 6 (solder resist films or the like) are formed on the surfaces of the first linear conductor patterns 20A to 20G on the outer surface of the substrate 1 (second principal surface PS2) and the second linear conductor patterns 50A to 50F.

Lastly, the mother substrate is divided to separate individual wireless IC devices (pieces) from each other.

Figure 8:
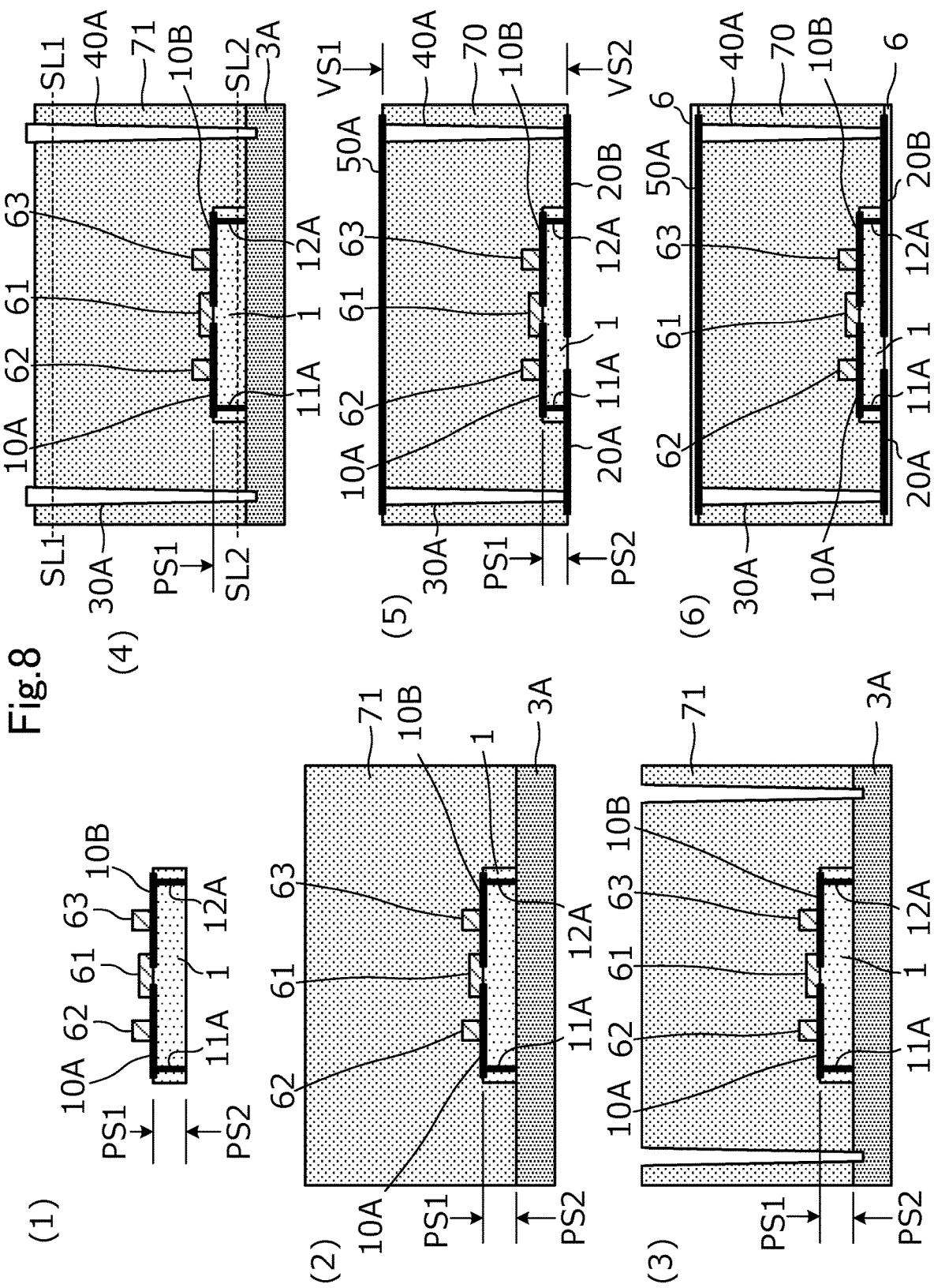
FIG. 8 is sectional view illustrating manufacturing steps of the wireless IC device 101 that are different from the manufacturing steps illustrated in FIGS. 6 and 7.

The wireless IC device 101 may instead be manufactured by, for example, the steps described below. FIG. 8 is sectional view illustrating manufacturing steps of the wireless IC device 101 that are different from the manufacturing steps illustrated in FIGS. 6 and 7.

First, as illustrated in part (1) of FIG. 8, the substrate 1 on which the RFIC element 61, the chip capacitors 62 and 63, etc., are mounted is prepared.

Next, as illustrated in part (2) of FIG. 8, the substrate 1 is mounted on a base 3A. After that, the resin member 70 is formed on (resin is applied to) the base 3A so that the resin member 70 has a height such that at least the RFIC element 61 and the substrate 1 are embedded. The substrate 1 may be mounted on the base 3A with an adhesive layer interposed therebetween. The base 3A is made of, for example, epoxy resin.

Next, as illustrated in part (3) of FIG. 8, holes 7 that extend in the normal direction to the base 3A are formed in the resin member 70. More specifically, the holes 7 are formed by drilling or by a laser so as to extend from the surface of the resin member 70 to the base 3A. The diameter of the holes 7 is greater than the outer shape of the metal posts 30A to 30F and 40A to 40F so that the metal posts 30A to 30F and 40A to 40F are able to be inserted into the holes 7.

Next, as illustrated in part (4) of FIG. 8, the metal posts 30A to 30F and 40A to 40F are inserted into the holes 7. Thus, the metal posts 30A to 30F and 40A to 40F are able to be disposed in the resin member 70 so as to extend in the normal direction to the base 3A.

Next, as illustrated in part (5) of FIG. 8, the base 3A is removed from the resin member 70, and head portions of the metal posts 30A to 30F and 40A to 40F and the interlayer connection conductors 11A and 12A are exposed at the surface of the resin member 70. After that, the second linear conductor patterns 50A to 50F are formed on the first surface VS1 of the resin member 70, and the first linear conductor patterns 20A to 20G are formed on the second surface VS2 of the resin member 70 and the second principal surface PS2 of the substrate 1.

More specifically, the resin member 70 is ground (or cut) in a planar manner, together with the metal posts, to the grinding line SL1 illustrated in part (4) of FIG. 8, so that head portions of the metal posts 30A to 30F and 40A to 40F are exposed at the surface of the resin member 70. The height of the metal posts 30A to 30F and 40A to 40F inserted in the holes 7 may be less than or equal to the height of the resin member 70. The resin member 70 is also ground (or cut) in a planar manner, together with the base 3A, the substrate 1, and the metal posts, to the grinding line SL2 illustrated in part (4) of FIG. 8, so that head portions of the metal posts 30A to 30F and 40A to 40F and the interlayer connection conductors 11A and 12A are exposed at the surface of the resin member 70. After that, the second linear conductor patterns 50A to 50F are formed on the first surface VS1 of the resin member 70, and the first linear conductor patterns 20A to 20G are formed on the second surface VS2 of the resin member 70 and the second principal surface PS2 of the substrate 1.

Next, as illustrated in part (6) of FIG. 8, anti-oxidation protective resin films 6 (solder resist films or the like) are formed on the surfaces of the first linear conductor patterns 20A to 20G on the outer surface of the substrate 1 (second principal surface PS2) and the second linear conductor patterns 50A to 50F.

Lastly, the mother substrate is divided to separate individual wireless IC devices (pieces) from each other.

Although the holes 7 extend from the surface of the resin member 70 to the base 3A in the above-described manufacturing method, the holes 7 are not limited to this. The holes 7 may instead be formed so as to extend through the resin member 70 and the base 3A, or extend to the interface between the resin member 70 and the base 3A. Furthermore, it is not necessary that the holes 7 extend to the base 3A. There is no particular limitation as long as the resin member 70 may be ground (or cut) in a planar manner, together with the base 3A, the substrate 1, and the metal posts, so that the head portions of the metal posts 30A to 30F and 40A to 40F and the interlayer connection conductors 11A and 12A are exposed at the surface of the resin member 70, as described above. Accordingly, in the case where the holes 7 do not extend to the base 3A, it is necessary that the holes 7 extend from the surface of the resin member 70 to a position closer to the second principal surface PS2 than the first principal surface PS1 is.

Figure 9:
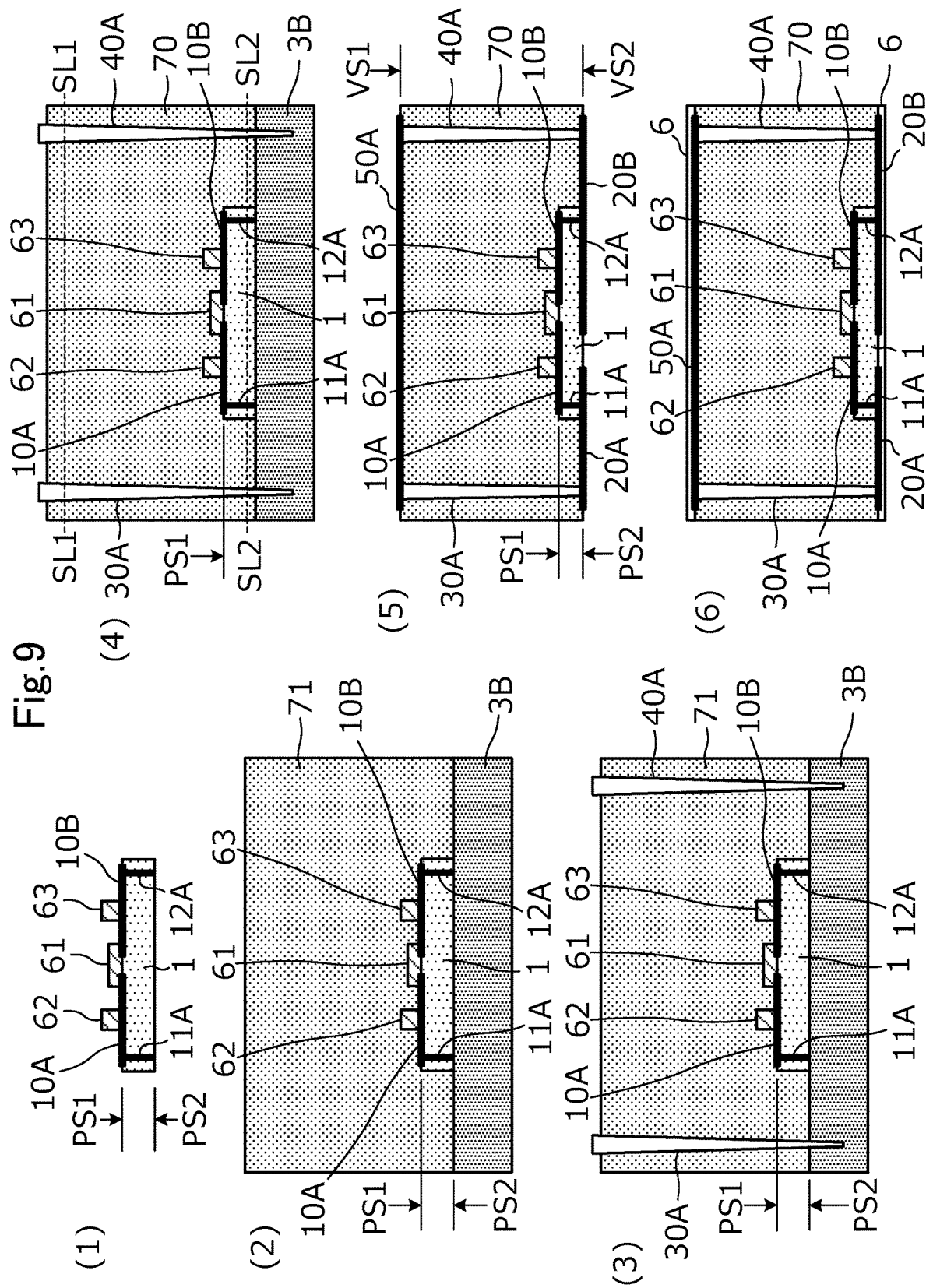
FIG. 9 is sectional view illustrating manufacturing steps of the wireless IC device 101 that are different from the manufacturing method illustrated in FIGS. 6, 7, and 8.

The wireless IC device 101 may instead be manufactured by, for example, the steps described below. FIG. 9 is sectional view illustrating manufacturing steps of the wireless IC device 101 that are different from the manufacturing method illustrated in FIGS. 6, 7, and 8.

First, as illustrated in part (1) of FIG. 9, the substrate 1 on which the RFIC element 61, the chip capacitors 62 and 63, etc., are mounted is prepared.

Next, as illustrated in part (2) of FIG. 9, the substrate 1 is mounted on a base 3B. After that, a resin member 71 is formed on (resin is applied to) the base 3B. The base 3B is a member having a predetermined thickness and cushioning properties. The resin member 71 is, for example, semi-hardened (stage B) epoxy resin.

Next, as illustrated in part (3) of FIG. 9, the metal posts 30A to 30F and 40A to 40F are inserted into the resin member 71 from the surface thereof toward the base 3B. More specifically, the metal posts 30A to 30F and 40A to 40F are inserted into the resin member 71 so as to extend in the normal direction to the base 3B. The metal posts 30A to 30F and 40A to 40F extend from the surface of the resin member 71 to the base 3B. Although the metal posts 30A to 30F and 40A to 40F illustrated in part (3) of FIG. 9 has a conical shape, the structure of the metal posts is not limited to this.

Next, as illustrated in part (4) of FIG. 9, the resin member 71 is hardened (the semi-hardened resin member 71 is converted into hardened resin member 70). Thus, the metal posts 30A to 30F and 40A to 40F are able to be disposed in the resin member 70 so as to extend in the normal direction to the base 3B. After that, the base 3B is removed from the resin member 70, and head portions of the metal posts 30A to 30F and 40A to 40F and the interlayer connection conductors 11A and 12A are exposed at the surface of the resin member 70.

More specifically, the resin member 70 is ground (or cut) in a planar manner, together with the metal posts 30A to 30F and 40A to 40F, to the grinding line SL1 illustrated in part (4) of FIG. 9, so that head portions of the metal posts 30A to 30F and 40A to 40F are exposed at the surface of the resin member 70. The resin member 70 is also ground (or cut) in a planar manner, together with the base 3B, the substrate 1, and the metal posts, to the grinding line SL2 illustrated in part (4) of FIG. 9, so that head portions of the metal posts 30A to 30F and 40A to 40F and the interlayer connection conductors 11A and 12A are exposed at the surface of the resin member 70.

Next, as illustrated in part (5) of FIG. 9, the second linear conductor patterns 50A to 50F are formed on the first surface VS1 of the resin member 70, and the first linear conductor patterns 20A to 20G are formed on the second surface VS2 of the resin member 70 and the second principal surface PS2 of the substrate 1.

Next, as illustrated in part (6) of FIG. 9, anti-oxidation protective resin films 6 (solder resist films or the like) are formed on the surfaces of the first linear conductor patterns 20A to 20G on the outer surface of the substrate 1 (second principal surface PS2) and the second linear conductor patterns 50A to 50F.

Lastly, the mother substrate is divided to separate individual wireless IC devices (pieces) from each other.

Although the metal posts 30A to 30F and 40A to 40F extend from the surface of the resin member 70 to the base 3B in the above-described manufacturing method, the metal posts 30A to 30F and 40A to 40F are not limited to this. The metal posts 30A to 30F and 40A to 40F may instead be formed so as to extend through the resin member 70 and the base 3B, or extend to the interface between the resin member 70 and the base 3B. Furthermore it is not necessary that the metal posts 30A to 30F and 40A to 40F extend to the base 3B. In such a case, it is necessary that the metal posts 30A to 30F and 40A to 40F extend from the surface of the resin member 70 to a position closer to the second principal surface PS2 than the first principal surface PS1 is.

The above-described manufacturing method has the following effects.

A durable, highly heat resistant wireless IC device including a coil antenna with a large coil opening area and good electrical characteristics, such as a low direct current resistance, is easily manufactured.

With the manufacturing method illustrated in FIG. 6, since the metal posts 30A to 30F and 40A to 40F are able to be securely fixed by using the base 3 having the adhesive layer 2, metal posts having a small diameter are able to be used in the manufacture of the coil antenna. Therefore, a coil antenna having a large winding number and a high inductance is able to be manufactured. The coil opening area is able to be further increased by using relatively tall metal posts having a small diameter.

Since the first surface VS1 of the resin member 70 is ground (or cut) in a planar manner so that the head portions of the metal posts 30A to 30F and 40A to 40F are exposed, the metal posts 30A to 30F and 40A to 40F are able to be easily connected to the second linear conductor patterns. In addition, the reliability of the connecting portions between the metal posts 30A to 30F and 40A to 40F and the second linear conductor patterns is increased.

The second surface VS2 of the resin member 70 and the second principal surface PS2 of the substrate 1 are ground (or cut) in a planar manner so that the head portions of the metal posts 30A to 30F and 40A to 40F and the interlayer connection conductors 11A and 12A are exposed. Therefore, the metal posts 30A to 30F and 40A to 40F are able to be easily connected to the first linear conductor patterns, and the interlayer connection conductors 11A and 12A are able to be easily connected to the first linear conductor patterns. In addition, the reliability of the connecting portions between the metal posts 30A to 30F and 40A to 40F and the first linear conductor patterns is increased, and the reliability of the connecting portions between the interlayer connection conductors 11A and 12A and the first linear conductor patterns is increased. As a result, the connection reliability between the metal posts 30A to 30F and 40A to 40F and the interlayer connection conductors 11A and 12A is increased.

The resin member 70 may contain magnetic powder, such as ferrite powder. In this case, since the resin member 70 is magnetic, the overall size required for the coil antenna to have a predetermined inductance is reduced. In addition, when the resin member 70 is magnetic, the side portions of the metal posts 30A to 30F and 40A to 40F may be exposed at the side surfaces of the resin member 70. In such a case, the magnetic field extends to the surfaces of the resin member 70 at which the metal posts 30A to 30F and 40A to 40F are exposed, and communications in these directions can also be achieved.

Second Preferred Embodiment

Figure 10:
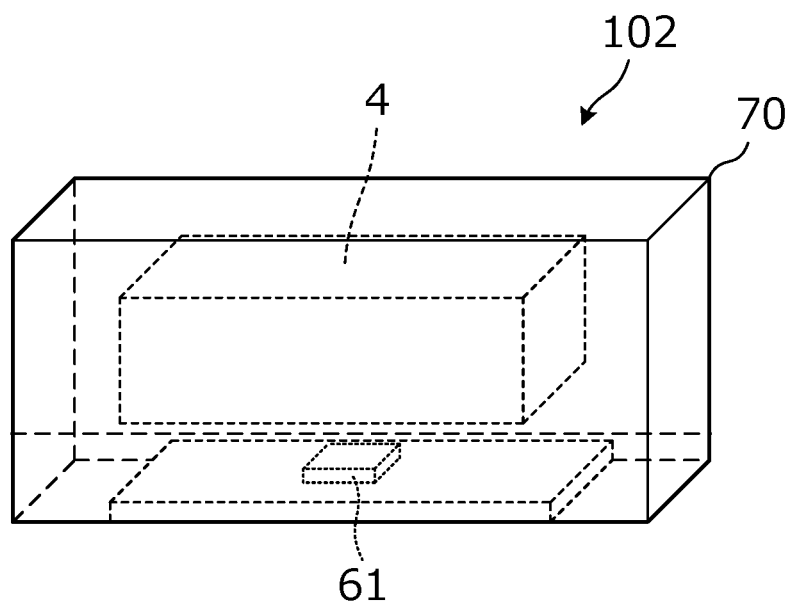
FIG. 10 is a perspective view of a wireless IC device 102 according to a second preferred embodiment of the present invention.
Figure 11:
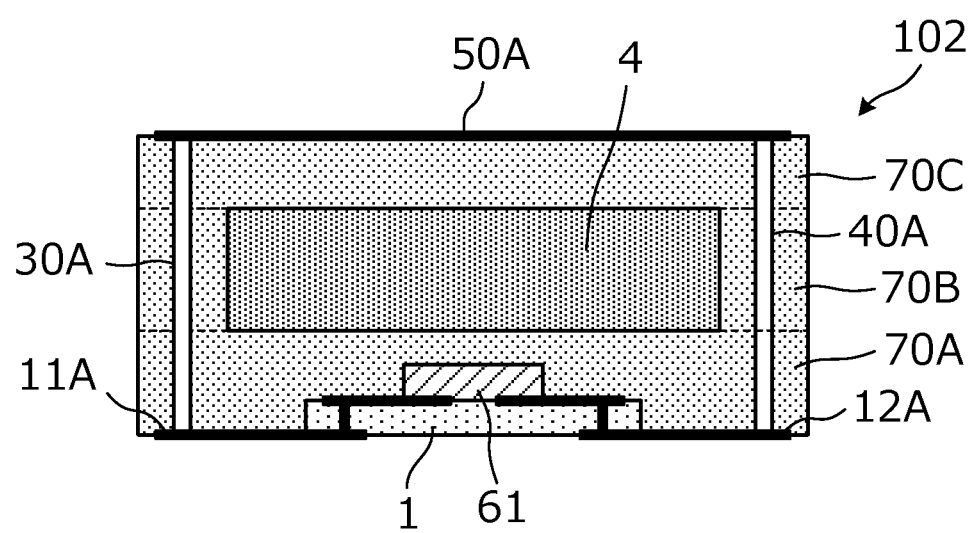
FIG. 11 is a sectional view of the wireless IC device 102.

FIG. 10 is a perspective view of a wireless IC device 102 according to a second preferred embodiment of the present invention. FIG. 11 is a sectional view of the wireless IC device 102.

A wireless IC device 102 according to the present preferred embodiment further includes a sintered-body-type magnetic core 4 including, for example, a ferrite sintered body that functions as a magnetic core of the coil antenna. In addition, a non-magnetic resin member is formed of resin layers 70A, 70B, and 70C. The other structures are the same as those described in the first preferred embodiment.

Figure 12:
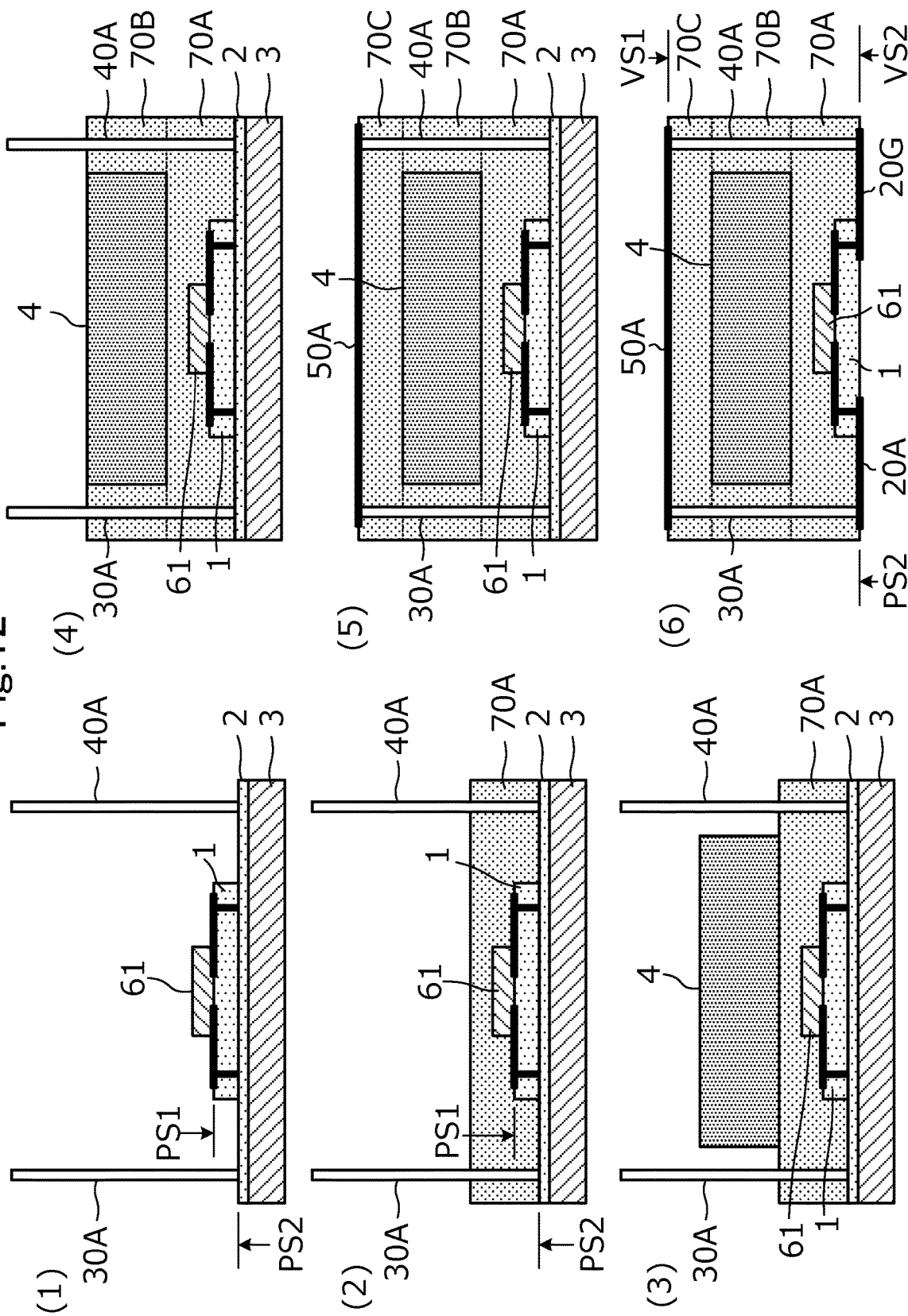
FIG. 12 is sectional view illustrating successive manufacturing steps of the wireless IC device 102.

The wireless IC device 102 according to the present preferred embodiment is manufactured by, for example, the steps described below. FIG. 12 is sectional view illustrating successive manufacturing steps of the wireless IC device 102.

As illustrated in part (1) of FIG. 12, the substrate 1 is prepared, and the RFIC element 61 is mounted on the first principal surface PS1 of the substrate 1.

Next, the substrate 1 and the metal posts 30A to 30F and 40A to 40F are mounted on an adhesive layer 2 of a base 3 having the adhesive layer 2. The substrate 1 is mounted on the base 3 such that the second principal surface PS2 thereof faces the adhesive layer 2. The metal posts 30A to 30F and 40A to 40F are mounted on the base 3 in a standing position with the first ends thereof facing the adhesive layer 2.

After that, the base 3 is covered with the resin layer 70A, which is a non-magnetic body made of epoxy resin or the like. Accordingly, the surface of the substrate 1 on which the RFIC element 61 is mounted (first principal surface PS1) is embedded in the resin layer 70A.

As illustrated in part (3) of FIG. 12, after the resin layer 70A is hardened, the magnetic core 4, which preferably has a rectangular or substantially rectangular parallelepiped shape, is mounted. The magnetic core 4 is preferably a small ferrite sintered body having a high magnetic permeability (for example, a relative magnetic permeability of about 50 to about 300). The magnetic core 4 may be mounted before the resin layer 70A is hardened.

Next, as illustrated in part (4) of FIG. 12, the resin layer 70B, which is made of epoxy resin or the like, is formed so that the thickness thereof is the same as the thickness of the magnetic core 4.

Next, as illustrated in part (5) of FIG. 12, the resin layer 70C, which is made of epoxy resin or the like, extends to the same height as, for example, the metal posts 30A to 30F and 40A to 40F. More specifically, the epoxy resin or the like is applied so as to extend to a predetermined height (height greater than or equal to the height to which the metal posts 30A to 30F and 40A to 40F extend), and then the surface of the resin layer 70C is ground in a planar manner so that head portions of, for example, the metal posts 30A to 30F and 40A to 40F are exposed.

After that, the second linear conductor patterns 50A to 50F are formed on the surface of the resin layer 70C. More specifically, a conductor film, such as a Cu film, is formed on the resin layer 70C, at which the head portions of the metal posts 30A to 30F and 40A to 40F are exposed, by plating or the like. Then, patterning is performed on the conductor film by forming a photoresist film and performing etching. The second linear conductor patterns 50A to 50F may instead be formed by screen printing by using conductive paste. Thus, the second linear conductor patterns 50A to 50F are connected to the metal posts 30A to 30F and 40A to 40F.

Next, as illustrated in part (6) of FIG. 12, the base 3 having the adhesive layer 2 is removed, and the first linear conductor patterns 20A to 20G are formed on the second surface VS2 of the resin layer 70A and the second principal surface PS2 of the substrate 1. The method for forming the first linear conductor pattern 20A and others are the same as that in the first preferred embodiment.

The following steps of Cu plating, Au plating, formation of a protective resin film on the second linear conductor patterns 50A to 50F, and separation into individual pieces are the same as those described in the first preferred embodiment. The protective resin film (solder resist film) at the rear side of the substrate 1 may be formed so as to cover portions excluding the portion connected to another substrate.

Figure 13:
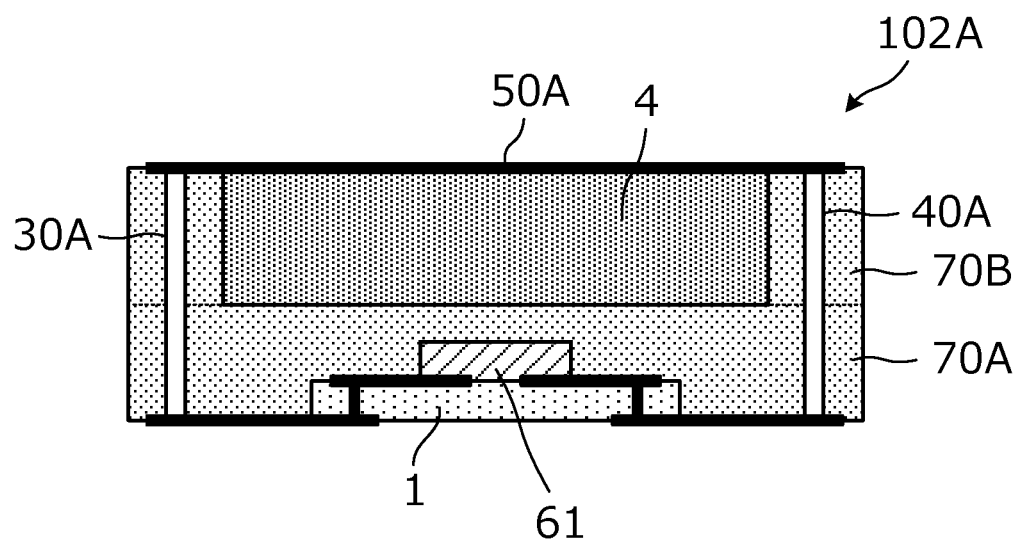
FIG. 13 is a sectional view of a wireless IC device 102A according to another structural example of a preferred embodiment of the present invention.

FIG. 13 is a sectional view of a wireless IC device 102A, which is another example of the present preferred embodiment. A comparison with FIG. 11 clearly shows that the resin layer 70C is not provided between the magnetic core 4 and the second linear conductor pattern 50A, and the resin layers 70A and 70B define the resin member. With this structure, a large magnetic core having a high magnetic permeability (for example, a relative magnetic permeability of about 50 to about 300) is able to be embedded. Also, the height is able to be reduced by reducing the overall thickness of the resin member.

In the present preferred embodiment, the first metal posts 30A to 30F, the second metal posts 40A to 40F, the first linear conductor patterns 20A to 20G, and the second linear conductor patterns 50A to 50F define the coil antenna, and the magnetic core is disposed in the coil antenna (in the winding area of the coil).

The present preferred embodiment provides the following effects.

A coil antenna having a predetermined inductance is able to be obtained without increasing the size of the coil antenna. Also, a predetermined inductance is able to be obtained even when the height of the coil antenna is reduced.

The magnetic field coupling between the coil antenna and an antenna that communicates with the coil antenna is able to be enhanced by the magnetism collecting effect of the magnetic core.

Since the first linear conductor patterns 20A to 20G, the second linear conductor patterns 50A to 50F, and the wiring conductor patterns 10A and 10B are not embedded in the magnetic body, the magnetic field extends to the surface of the substrate and the surface of the resin layer 70C, and communication distances in these direction are increased.

The noise generated when digital signals are input to and output from the RFIC element 61 is hardly superposed on the coil antenna. The reason for this will now be described.

Since the RFIC element 61 is connected to the coil antenna with a minimum distance therebetween, the occurrence of unnecessary coupling between the magnetic field (noise) generated by the propagation of the digital signals and the coil antenna is low. Therefore, the noise is not superposed on the analog signal circuit, which is very weak, and the wireless communication is hardly adversely affected.

Third Preferred Embodiment

Figure 14:
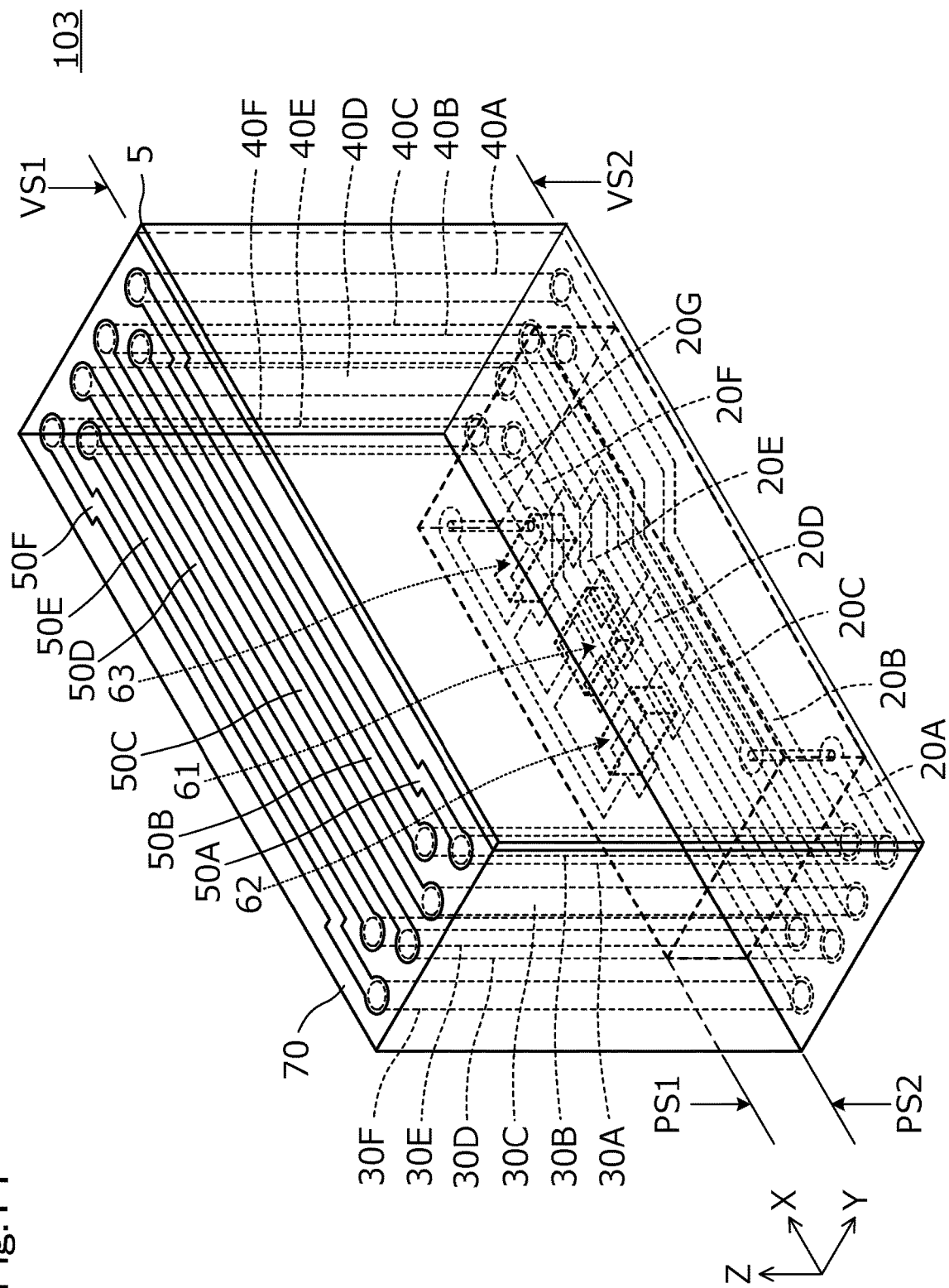
FIG. 14 is a perspective view of a wireless IC device 103 according to a third preferred embodiment of the present invention.

FIG. 14 is a perspective view of a wireless IC device 103 according to a third preferred embodiment of the present invention. The wireless IC device 103 according to the present preferred embodiment differs from the wireless IC device 101 according to the first preferred embodiment in that a magnetic sheet 5 is attached to one side surface of the resin member 70. The magnetic sheet 5 is, for example, a resin sheet made of a resin, such as epoxy resin, in which magnetic powder, such as ferrite powder, is dispersed. The other structures are the same as to those of the wireless IC device 101 according to the first preferred embodiment.

In the present preferred embodiment, the first linear conductor patterns 20A to 20G, the first metal posts 30A to 30F, the second linear conductor patterns 50A to 50F, and the second metal posts 40A to 40F define a six-turn helical coil antenna. The magnetic sheet 5 is provided at one of the coil openings of this coil antenna.

According to the present preferred embodiment, a coil antenna having a predetermined inductance is able to be obtained without increasing the size of the coil antenna. In addition, when this RFID device is bonded to an article (in particular, a metal surface of an article), the influence of the article on the coil antenna is able to be reduced by bonding the RFID device such that the side at which the magnetic sheet is provided faces the article. In addition, the magnetic field coupling between the coil antenna and an antenna that communicates with the coil antenna is able to be enhanced by the magnetism collecting effect of the magnetic core.

Fourth Preferred Embodiment

Figure 15:
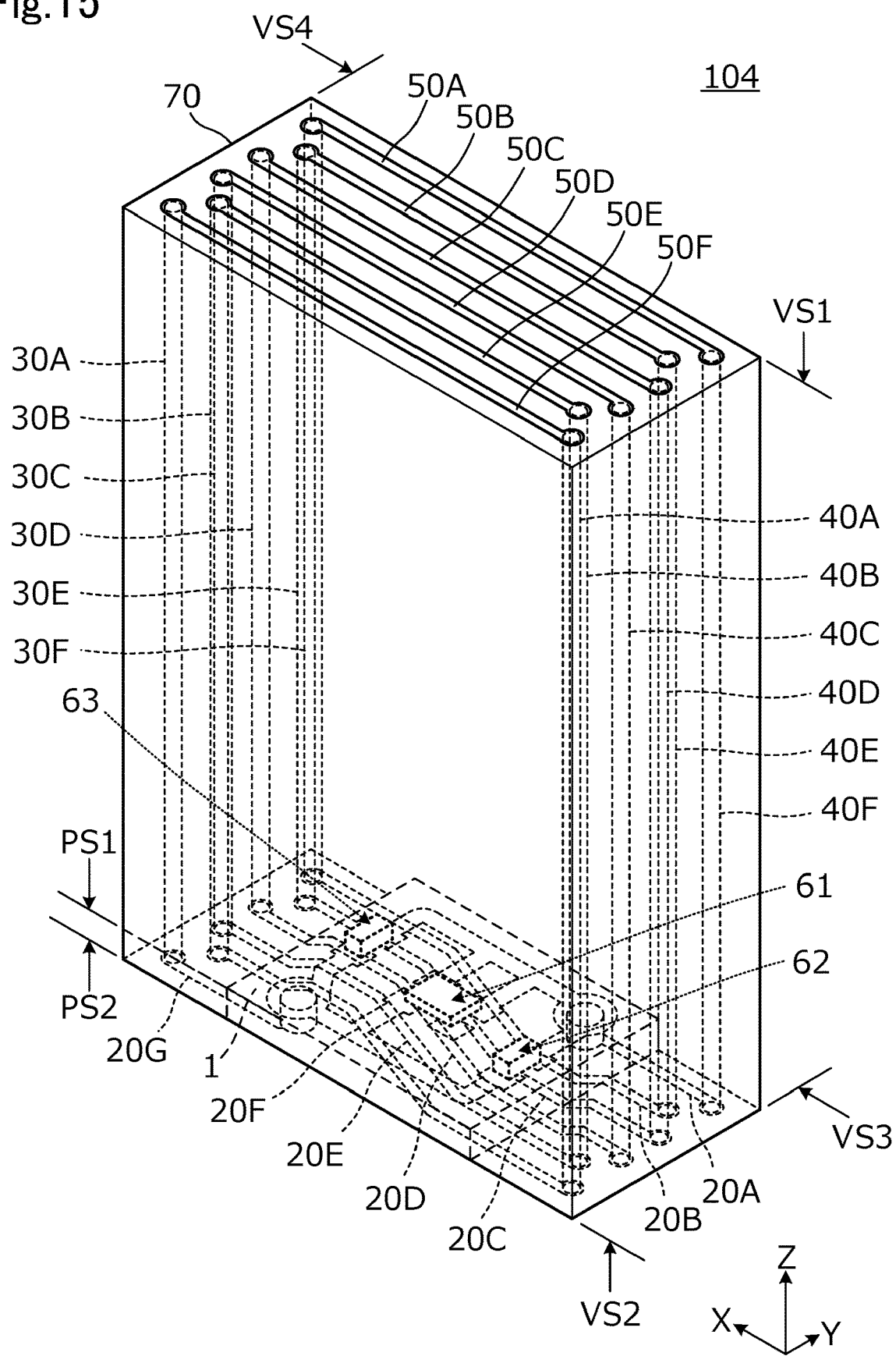
FIG. 15 is a perspective view of a wireless IC device 104 according to a fourth preferred embodiment of the present invention.
Figure 16A:
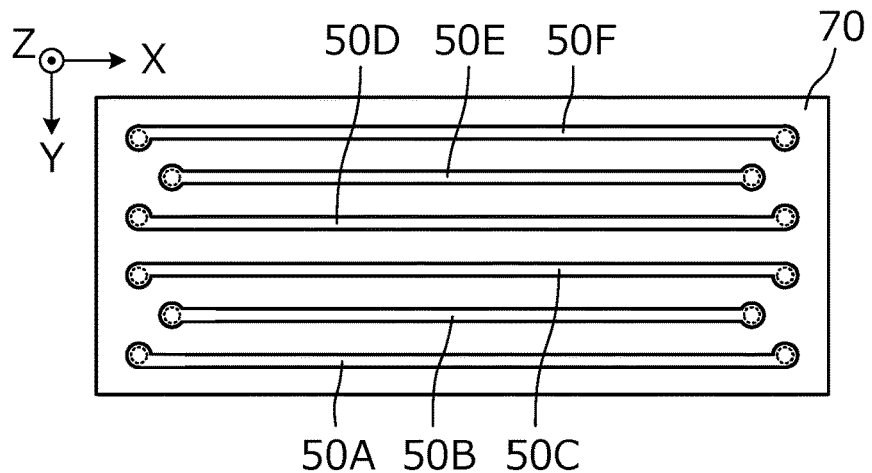
FIG. 16A is a plan view of the wireless IC device 104.
Figure 16B:
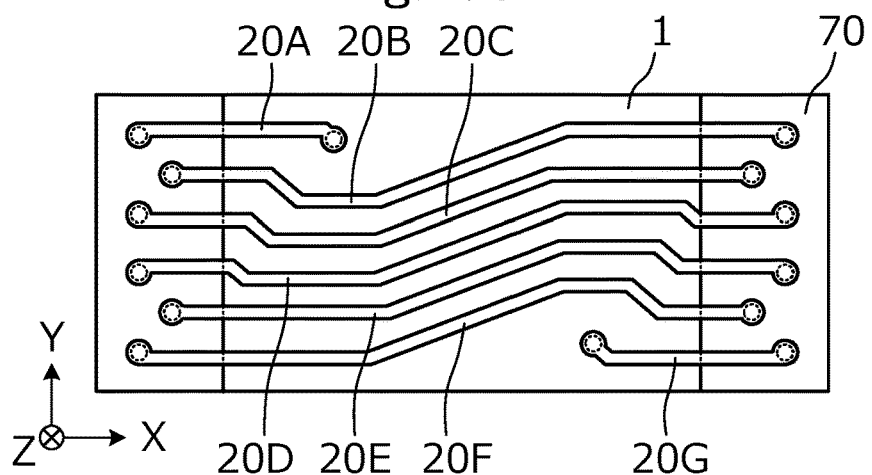
FIG. 16B is a bottom view of the wireless IC device 104.
Figure 16C:
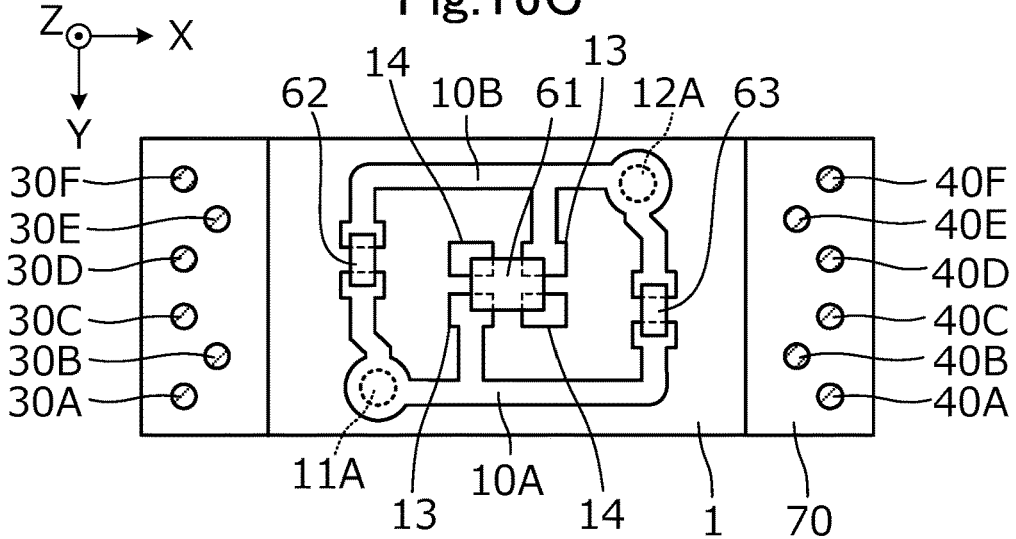
FIG. 16C is a plan view of a substrate 1 (view of a first principal surface PS1).

FIG. 15 is a perspective view of a wireless IC device 104 according to a fourth preferred embodiment of the present invention. FIG. 16A is a plan view of the wireless IC device 104, FIG. 16B is a bottom view of the wireless IC device 104, and FIG. 16C is a plan view of a substrate 1 (view of a first principal surface PS1).

The wireless IC device 104 according to the present preferred embodiment differs from the wireless IC device 101 according to the first preferred embodiment in that the resin member 70 preferably has a rectangular or substantially rectangular parallelepiped shape having a longitudinal direction that coincides with the Z-axis direction of an orthogonal X-Y-Z coordinate system, for example. The other structures are substantially the same as those of the wireless IC device 101 according to the first preferred embodiment.

In the present preferred embodiment, the height dimension (height in the Z-axis direction of the orthogonal X-Y-Z coordinate system) of the first metal posts 30A to 30F and the second metal posts 40A to 40F is greater than that in the first preferred embodiment. In other words, in the present preferred embodiment, the aspect ratio (height/bottom surface diameter) of the first metal posts 30A to 30F and the second metal posts 40A to 40F is higher than that in the first preferred embodiment.

In the present preferred embodiment, the first linear conductor patterns 20A to 20G, the first metal posts 30A to 30F, the second linear conductor patterns 50A to 50F, and the second metal posts 40A to 40F define a six-turn helical coil antenna. The coil openings of the coil antenna preferably have a rectangular or substantially rectangular shape having a longitudinal direction that coincides with the Z-axis direction of the orthogonal X-Y-Z coordinate system, as illustrated in FIG. 15.

In addition, in the present preferred embodiment, the main body of the wireless IC device 104 including the resin member 70 and the substrate 1 preferably has a rectangular or substantially rectangular parallelepiped shape having a longitudinal direction that coincides with the Z-axis direction of the orthogonal X-Y-Z coordinate system. The area of the first surface VS1 of the wireless IC device 104 according to the present preferred embodiment is substantially the same as the area of the first surface VS1 of the wireless IC device 101 according to the first preferred embodiment.

The present preferred embodiment provides the following effects.

According to the present preferred embodiment, large portions of the coil antenna are occupied by the metal posts. Therefore, when the coil opening area of the coil antenna according to the present preferred embodiment is the same as that of the coil antenna according to the first preferred embodiment, the DCR of the entire coil antenna is able to be reduced and a coil antenna having a high Q value (low loss) is able to be obtained. Conversely, in the present preferred embodiment, when the DCR of the entire coil antenna is same as that of the coil antenna according to the first preferred embodiment, the coil opening area of the coil antenna is greater than that of the coil antenna according to the first preferred embodiment. Therefore, the coil antenna is capable of communicating with another antenna with a relatively large distance therebetween.

As described above, the area of the first surface VS1 of the wireless IC device 104 according to the present preferred embodiment is substantially the same as the area of the first surface VS1 of the wireless IC device 101 according to the first preferred embodiment. In other words, the same number of wireless IC devices 104 as the number of wireless IC devices 101 according to the first preferred embodiment is able to be separated from the mother substrate. Conversely, in the present preferred embodiment, a wireless IC device in which the area of the first surface VS1 is smaller than that in the wireless IC device 101 according to the first preferred embodiment and in which the coil opening area is substantially the same as that in the wireless IC device 101 can be obtained. Therefore, according to the present preferred embodiment, a larger number of wireless IC devices having a coil opening area that is substantially the same as that in the wireless IC device 101 is able to be separated from a mother substrate having the same area (area in the XY plane).

Fifth Preferred Embodiment

Figure 17:
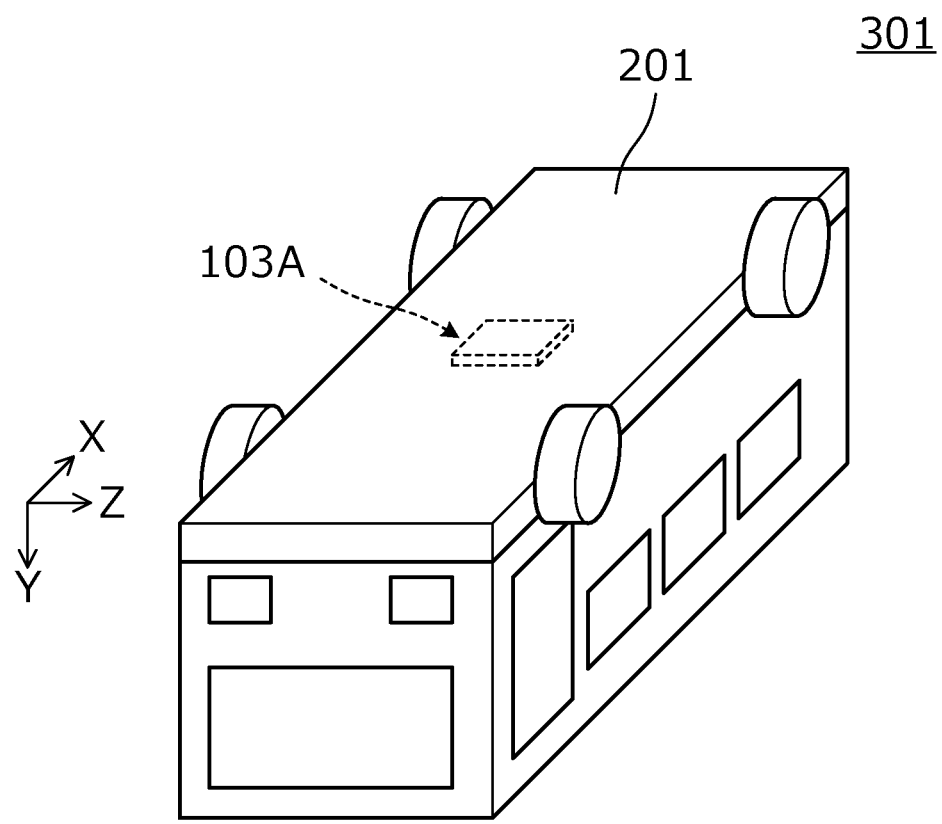
FIG. 17 is a perspective view of an article 301 having an RFID tag according to a fifth preferred embodiment of the present invention.
Figure 18:
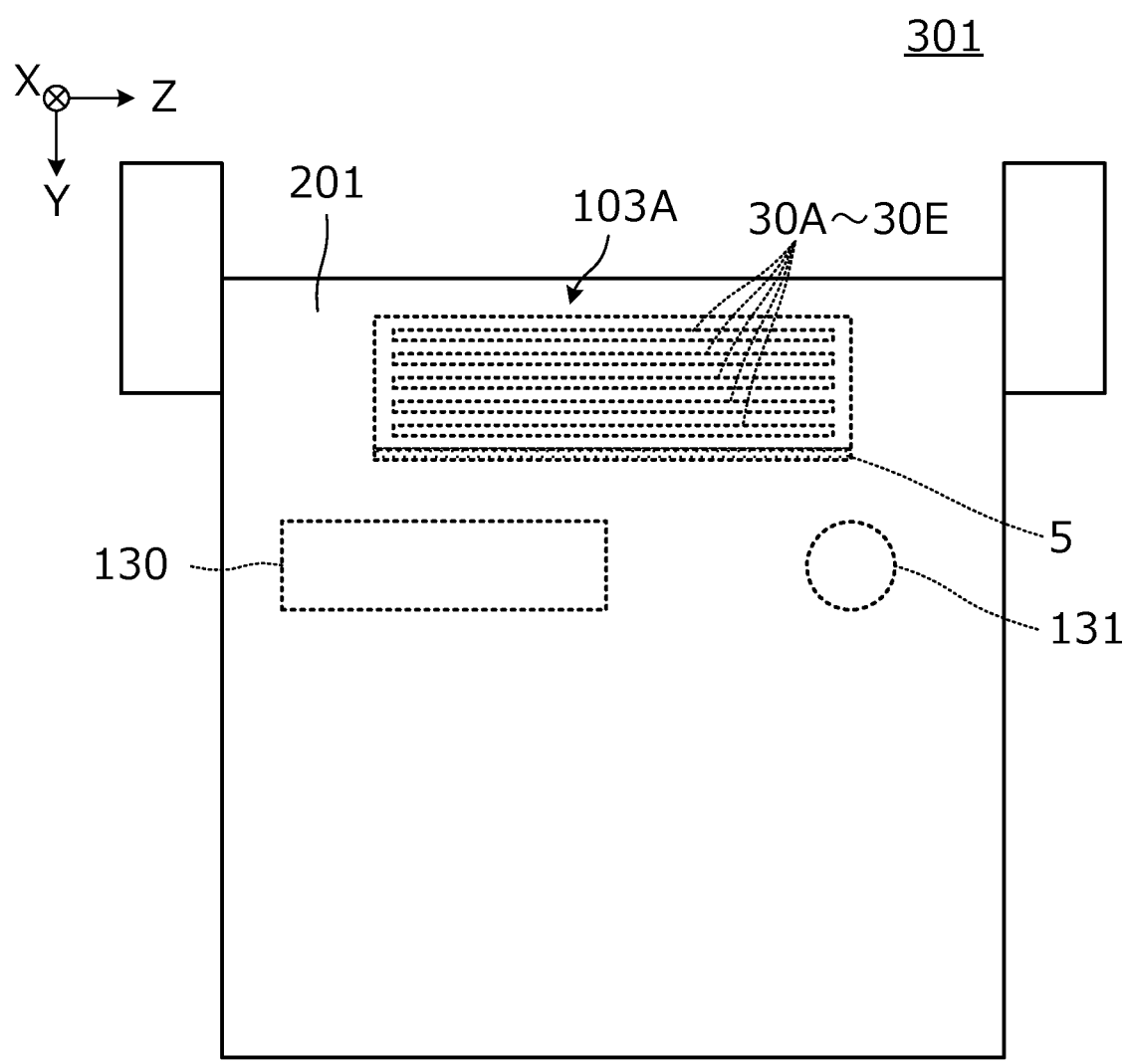
FIG. 18 is a front view of the article 301 including the RFID tag.

FIG. 17 is a perspective view of an article 301 having an RFID tag according to a fifth preferred embodiment of the present invention. FIG. 18 is a front view of the article 301 having the RFID tag. The article 301 including the RFID tag preferably is a toy, such as a miniature car, formed by resin molding, for example. The article 301 having the RFID tag corresponds to a "molded resin article".

The article 301 including the RFID tag includes a wireless IC device 103A. The basic structure of the wireless IC device 103A is the same as that of the wireless IC device 103 according to the third preferred embodiment. The wireless IC device 103A according to the present preferred embodiment includes a coil antenna including first metal posts 30A to 30E, and the number of turns of the coil antenna is "5". The wireless IC device 103A is used as the RFID tag.

The wireless IC device 103A is embedded in a molded resin article 201, and is not exposed to the outside of the article 301. Resin injection molding is performed while the wireless IC device 103A is fixed to a mold to form the molded resin article 201 by injection molding. The wireless IC device 103A is embedded in a bottom portion of the toy (at a position near the top surface of the article 301 having the RFID tag disposed therein in FIG. 17). The magnetic sheet 5 of the wireless IC device 103A is located closer to the inside (inner region) of the molded resin article 201 than the coil antenna. Conductors such as a battery pack 130 and a metal member 131 are disposed in the molded resin article 201. Since the magnetic sheet 5 is disposed between these conductors and the coil antenna, the coil antenna is not easily affected by the conductors, and loss due to an eddy current is able to be reduced.

Similar to the wireless IC devices according to other preferred embodiments of the present invention, the RFIC element and other components are protected by the resin member 70, and therefore the wireless IC device 103A is durable. In addition, solder connecting portions of the surface mount chip components are protected from high-temperature resin that flows during injection molding. More specifically, even when the solder of the solder connecting portions of the surface mount chip components is melted once due to the heat applied during injection molding, the positional relationship between the surface mount chip components, such as the RFIC element 61, and the substrate is continuously fixed by the resin member 70. For example, although the temperature of the mold for injection molding is about several tens of degrees above 100° C., the temperature at the distal end of the injection molding nozzle is as high as several tens of degrees above 300° C. Therefore, there is a possibility that the solder of the solder connecting portions of the surface mount chip components will be melted once. However, even when the solder is melted once, the positional relationship between the surface mount chip components and the substrate 1 is fixed by the resin member 70. Therefore, the solder connecting portions of the surface mount chip components return to the connecting state before injection molding after they are cooled. If a common wire-wound coil component in which a Cu wire coated with a polyimide based resin film is wound is used, the coating will be melted due to the heat applied during injection molding, and short-circuiting between portions of the Cu wire may occur. Therefore, it is difficult to use a common wire-wound coil component as a coil antenna.

The winding axis of the coil antenna of the wireless IC device 103A extends in the normal direction to the bottom surface of the toy, such as a miniature car. Therefore, when the bottom surface of the toy is placed so as to face a reader of a reader/writer device, the reader/writer device communicates with the wireless IC device 103A. Thus, the reader/writer device or a host device connected to the reader/writer device performs a predetermined process.

In the present preferred embodiment, a toy formed by resin molding is described as an example of the article 301 having the RFID tag. However, the article having the RFID tag is not limited to this, and may instead be, for example, a container for food or the like in which a wireless IC device is embedded by resin molding.

Sixth Preferred Embodiment

Figure 19:
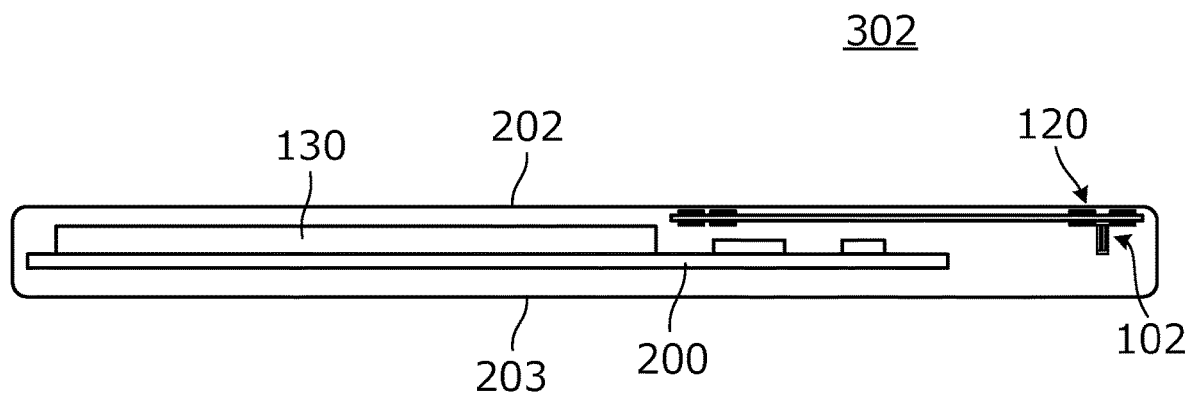
FIG. 19 is a sectional view of an article 302 in which an RFID tag is disposed.
Figure 20:
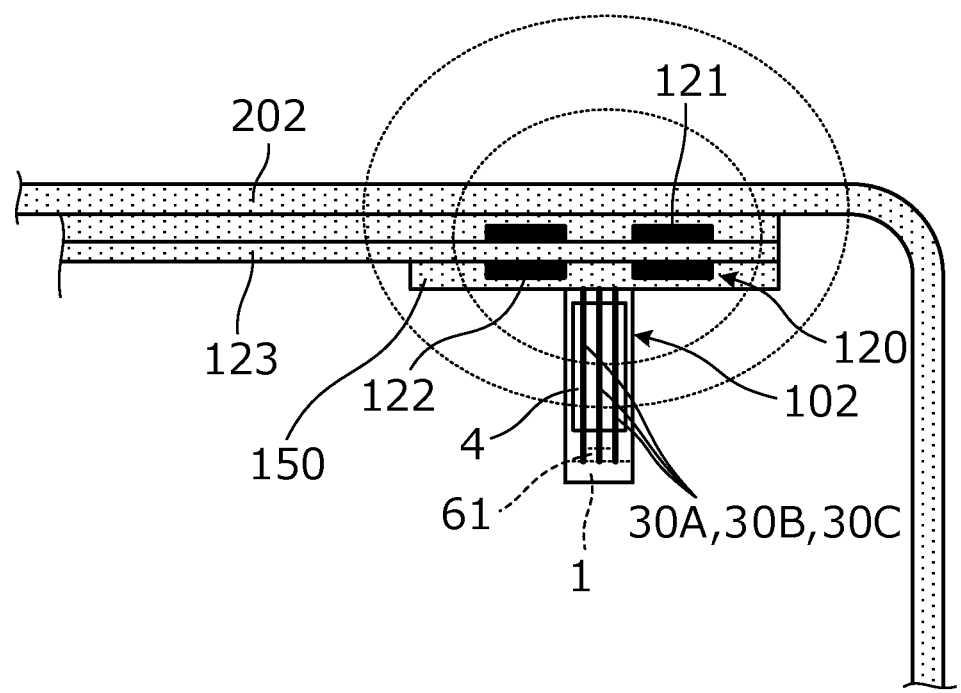
FIG. 20 is a partial enlarged view of FIG. 19.

FIG. 19 is a sectional view of an article 302 in which an RFID tag is disposed. FIG. 20 is a partial enlarged view of FIG. 19.

The article 302 in which the RFID tag is disposed is, for example, a portable electronic device such as a smart phone, and includes the wireless IC device 102 and a booster antenna 120 having a resonant frequency. The article 302 in which the RFID tag is disposed includes a lower housing 202 at the upper side in FIG. 19 and an upper housing 203 at the lower side in FIG. 19. A circuit substrate 200, the wireless IC device 102, and the booster antenna 120 having a resonant frequency are disposed in the space surrounded by the lower housing 202 and the upper housing 203.

The wireless IC device 102 is structured as described in the second preferred embodiment. As illustrated in FIG. 20, the wireless IC device 102 is attached to the booster antenna 120 with an adhesive sheet 150 interposed therebetween. A battery pack 130 and other components are mounted on the circuit substrate 200.

The booster antenna 120 having a resonant frequency is attached to an inner surface of the lower housing 202. The booster antenna 120 is disposed at a location where the booster antenna 120 does not overlap the battery pack 130. The booster antenna 120 includes an insulator substrate 123 and coil patterns 121 and 122 on the insulator substrate 123.

The wireless IC device 102 is arranged so that the magnetic flux is linked with the coil antenna thereof and the booster antenna 120. More specifically, the wireless IC device 102 and the booster antenna 120 are arranged so that magnetic field coupling occurs between the coil antenna of the wireless IC device 102 and the coil of the booster antenna 120. In FIG. 20, the dashed lines conceptually indicate the magnetic flux that contributes to the magnetic field coupling.

The coil antenna of the wireless IC device 102 faces (is adjacent to) the booster antenna 120, and the RFIC element is disposed at a side opposite to the side adjacent to the booster antenna 120. Therefore, the degree of coupling between the coil antenna of the wireless IC device 102 and the booster antenna 120 is high. Wires that connect the RFIC element 61 to other circuit elements (in particular, digital signal line and power supply line) are arranged so as to be parallel or substantially parallel to the magnetic flux of the coil antenna. Therefore, the degree of coupling between the wires and the coil antenna is low.

Figure 21:
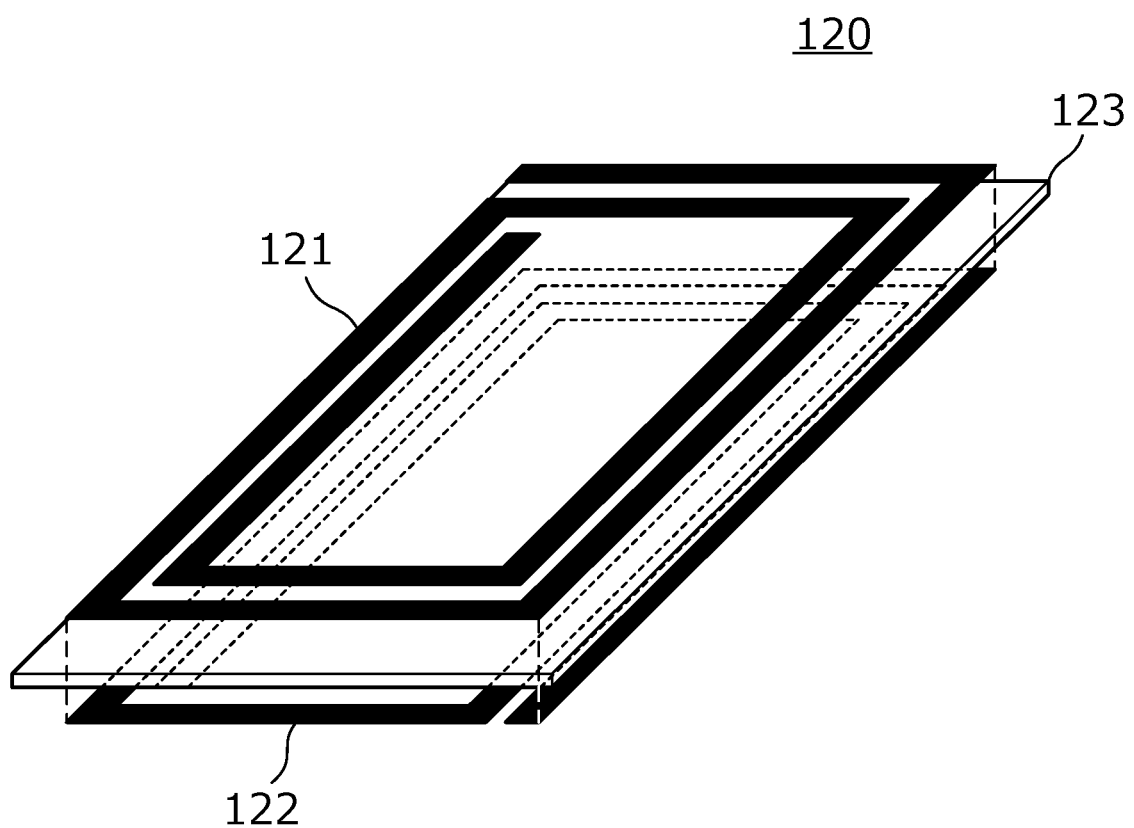
FIG. 21 is a perspective view of a booster antenna 120.
Figure 22:
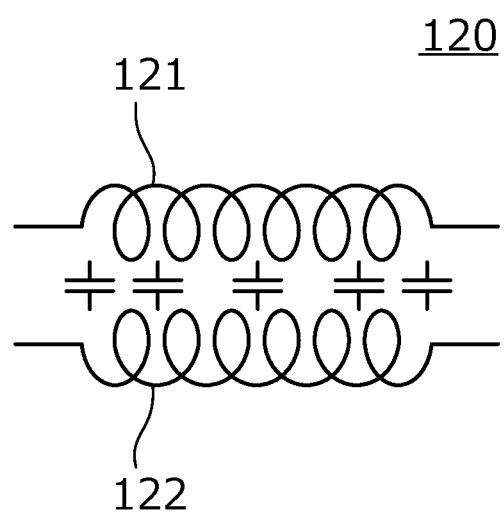
FIG. 22 is a circuit diagram of the booster antenna 120.

FIG. 21 is a perspective view of the booster antenna 120. FIG. 22 is a circuit diagram of the booster antenna 120. In the booster antenna 120, the first coil pattern 121 and the second coil pattern 122 are conductors arranged in a rectangular or substantially rectangular spiral pattern so that capacitive coupling is achieved when currents flow therethrough in the same direction in plan view. A stray capacitance is generated between the first coil pattern 121 and the second coil pattern 122. The inductances of the first coil pattern 121 and the second coil pattern 122 and the stay capacitance define an LC resonant circuit. The resonant frequency of the LC resonant circuit is equal or substantially equal to the communication frequency of the RFID system. The communication frequency is, for example, 13.56 MHz band.

In the present preferred embodiment, communication is able to be carried out by using large coil openings of the booster antenna. Therefore, the maximum distance over which communication is able to be carried out is increased.

The above-described preferred embodiments are illustrative in all points and are not limiting. It is obvious that a person skilled in the art can make changes and modifications. For example, the structures of different preferred embodiments may be partially replaced or combined together. The scope of the present invention is defined not by the above-described preferred embodiments, but by the claims. In addition, the scope of the present invention is intended to include equivalents to the scope of the claims and all modifications within the scope of the claims.

For example, the frequency band of the coil antenna (the RFID tag) is not limited to HF-band, and may instead be LF-band, UHF-band, or SHF-band. The article to which the RFID tag is attached is not limited to a toy, and may instead be, for example, a portable information terminal, such as a cellular phone, a building material, such as a scaffolding material, or an industrial material, such as a gas cylinder.

Although the RFIC element 61 is preferably mounted on the first principal surface PS1 of the substrate 1, the structure is not limited to this. The RFIC element 61 may instead be, for example, disposed in the substrate 1. Alternatively, a cavity may be formed in the first principal surface PS1 or the second principal surface PS2 of the substrate 1, and the RFIC element may be disposed in the cavity.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wireless IC device comprising:
   a substrate including a first principal surface and a second principal surface that faces the first principal surface;
   a resin member covering at least the first principal surface of the substrate;
   an RFIC element mounted on the first principal surface of the substrate; and
   a coil antenna connected to the RFIC element; wherein
   the coil antenna includes a winding axis along the first principal surface and the second principal surface of the substrate; and
   when viewed in a direction of the winding axis, the coil antenna has a rectangular or substantially rectangular shape in which a portion of one side is provided in contact with the substrate, and the other three sides are provided in contact with the resin member.

2. The wireless IC device according to claim 1, further comprising:
   a body including the substrate, the resin member, the RFIC element, and the coil antenna, the body including a first surface and a second surface that faces the first surface; wherein
   the second principal surface of the substrate defines at least a portion of the second surface of the body;
   the resin member is disposed adjacent to the first principal surface of the substrate, and includes a surface that defines the first surface of the body, the surface being opposite to the first principal surface of the substrate;
   the RFIC element is disposed between the substrate and the resin member; and
   the RFIC element is disposed in the coil antenna and closer to the second surface than to the first surface, the RFIC element being connected to the coil antenna via the substrate.

3. The wireless IC device according to claim 2, wherein the coil antenna includes:
   a first linear conductor pattern on the second surface of the body;
   a first metal post including a first end and a second end that respectively extend to the first surface and the second surface of the body, the first end being connected to the first linear conductor pattern;
   a second metal post including a first end and a second end that respectively extend to the first surface and the second surface of the body, the first end being connected to the first linear conductor pattern; and
   a second linear conductor pattern on the first surface of the body, the second linear conductor pattern connecting the second end of the first metal post and the second end of the second metal post to each other.

4. The wireless IC device according to claim 3, wherein the first metal post and the second metal post are longer than the first linear conductor pattern or the second linear conductor pattern.

5. The wireless IC device according to claim 3, wherein the substrate is embedded in the resin member so that the second principal surface of the substrate and a surface of the resin member are flush with each other;
the first linear conductor pattern extends over the second principal surface of the substrate and the surface of the resin member.

6. The wireless IC device according to claim 1, further comprising a magnetic body that defines a magnetic core for the coil antenna.

7. The wireless IC device according to claim 3, wherein the first liner conductor pattern, the second linear conductor pattern, the first metal post, and the second metal post are provided in a plurality;
the plurality of the first linear conductor patterns extend in an X-axis direction of an orthogonal X-Y-Z coordinate system;
the plurality of the second linear conductor patterns extend in the X-axis direction of the orthogonal X-Y-Z coordinate system;
the plurality of the first metal posts are arranged in a Y-axis direction of the orthogonal X-Y-Z coordinate system and extend in a Z-axis direction of the orthogonal X-Y-Z coordinate system;
the plurality of the second metal posts are arranged in the Y-axis direction of the orthogonal X-Y-Z coordinate system and extend in the Z-axis direction of the orthogonal X-Y-Z coordinate system; and
the plurality of the first metal posts, the plurality of the second metal posts, the plurality of the first linear conductor patterns, and the plurality of the second linear conductor patterns define a helical coil antenna.

8. The wireless IC device according to claim 7, wherein at least one of the plurality of the first linear conductor patterns extends through a region that overlaps the second principal surface of the substrate when viewed in the Z-axis direction, and connects the first end of at least one of the plurality of first metal posts and the first end of at least one of the plurality of second metal posts to each other.

9. The wireless IC device according to claim 7, wherein a number of the first metal posts and a number of the second metal posts are each 3 or more; and
the plurality of the first metal posts and the plurality of the second metal posts are arranged in the Y-axis direction and are disposed in a staggered pattern when viewed in the Z-axis direction.

10. The wireless IC device according to claim 9, wherein the helical coil antenna includes a plurality of types of loops with different inner and outer diameters when viewed in the Y-axis direction, and two of the plurality of loops at opening surfaces of the helical coil antenna are loops of one of the plurality of types of loops that has largest inner and outer diameters.

11. The wireless IC device according to claim 1, wherein the RFIC element is connected to an interlayer conductor in the substrate by a wiring conductor pattern on the first principal surface of the substrate.

12. The wireless IC device according to claim 1, further comprising a capacitor connected to the RFIC element.

* * * * *